(12) United States Patent
Park

(10) Patent No.: US 9,834,857 B2
(45) Date of Patent: Dec. 5, 2017

(54) INGOT RAW MATERIAL SUPPLY SYSTEM

(71) Applicant: S-TECH CO., LTD., Daegu (KR)

(72) Inventor: Jin Sub Park, Daegu (KR)

(73) Assignee: S-TECH CO., LTD., Daegu (KR)

( * ) Notice: Subject to any disclaimer, the term of this patent is extended or adjusted under 35 U.S.C. 154(b) by 52 days.

(21) Appl. No.: 14/438,879

(22) PCT Filed: May 16, 2013

(86) PCT No.: PCT/KR2013/004346
§ 371 (c)(1),
(2) Date: Jun. 2, 2015

(87) PCT Pub. No.: WO2014/185572
PCT Pub. Date: Nov. 20, 2014

(65) Prior Publication Data
US 2016/0060787 A1      Mar. 3, 2016

(30) Foreign Application Priority Data

May 16, 2013 (KR) .................. 10-2013-0055426

(51) Int. Cl.
*C30B 15/04* (2006.01)
*C30B 29/06* (2006.01)
*C30B 15/10* (2006.01)

(52) U.S. Cl.
CPC .............. *C30B 15/04* (2013.01); *C30B 15/10* (2013.01); *C30B 29/06* (2013.01)

(58) Field of Classification Search
CPC ......... C30B 15/00; C30B 15/02; C30B 15/04; C30B 15/10; C30B 29/00; C30B 29/02; C30B 29/06; Y10T 117/00; Y10T 117/10; Y10T 117/1004; Y10T 117/1008; Y10T 117/1024; Y10T 117/1032; Y10T 117/1056

(Continued)

(56) References Cited

U.S. PATENT DOCUMENTS 2,189,079 A * 2/1940 Mueller .................... B62B 1/24
280/17.12
5,156,521 A * 10/1992 Crabb ..................... C30B 29/06
118/719

(Continued)

FOREIGN PATENT DOCUMENTS

KR    10-2012-0116091    * 10/2012

*Primary Examiner* — Kenneth A Bratland, Jr.
(74) *Attorney, Agent, or Firm* — John K. Park; Park Law Firm

(57) ABSTRACT

A raw material supply system for supplying a fixed amount of raw material necessary for ingot growth is disclosed. The system includes a support unit, an enclosure, a fixed amount supply unit, a hopper for supplying raw material to the fixed amount supply unit, a dopant supply unit for supplying a predetermined amount of dopant into the enclosure, a supply pipe for supplying a fixed amount of raw material and dopant to a crucible, a lifting mechanism for moving the supply pipe upward and downward, a moving mechanism for protruding an inclined chute to an upper part of the supply pipe, and a load cell mounted between the support unit and the enclosure for sensing the weight of the supplied raw material and inputting the sensed weight of the raw material to a controller.

14 Claims, 18 Drawing Sheets

(58) Field of Classification Search
USPC .......... 117/11, 13–15, 19, 21, 200–202, 206, 117/208, 214, 928, 931–932
See application file for complete search history.

(56) References Cited

U.S. PATENT DOCUMENTS

| | | | |
|---|---|---|---|
| 6,231,669 B1* | 5/2001 | Altekruger | C30B 15/02 117/18 |
| 2007/0056504 A1* | 3/2007 | Lim | C30B 15/04 117/13 |
| 2012/0228081 A1* | 9/2012 | Tadokoro | B65G 11/146 193/30 |

* cited by examiner

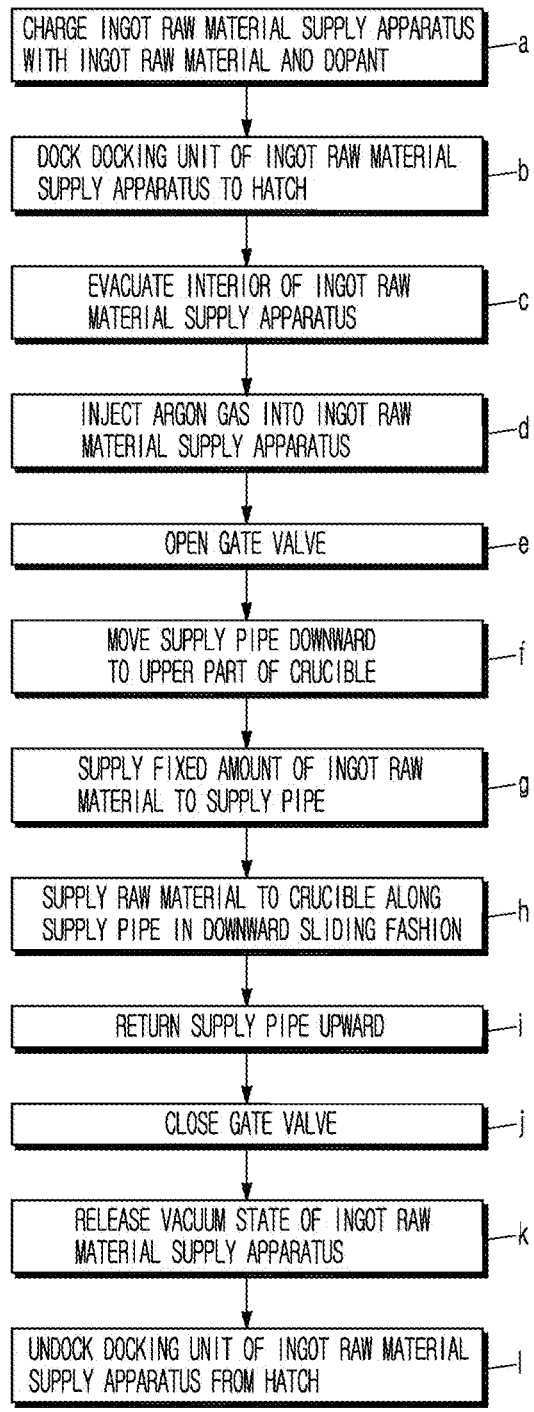

[FIG. 2]
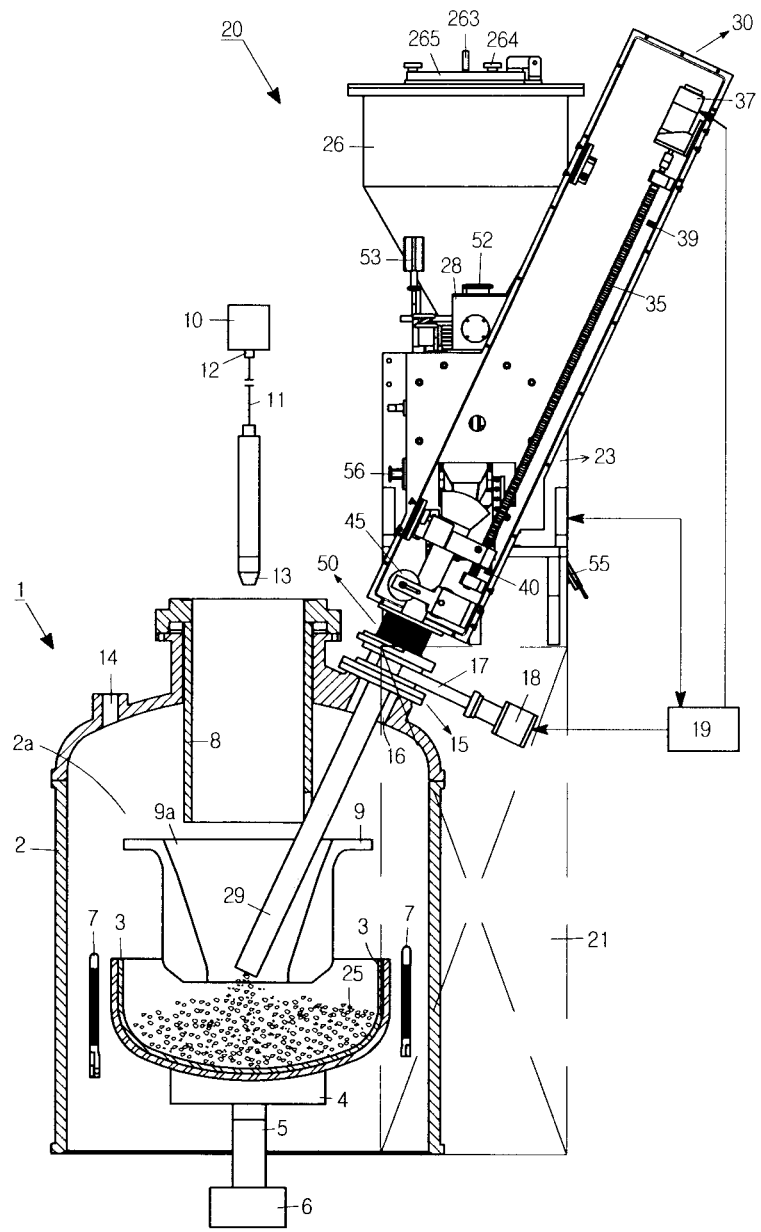

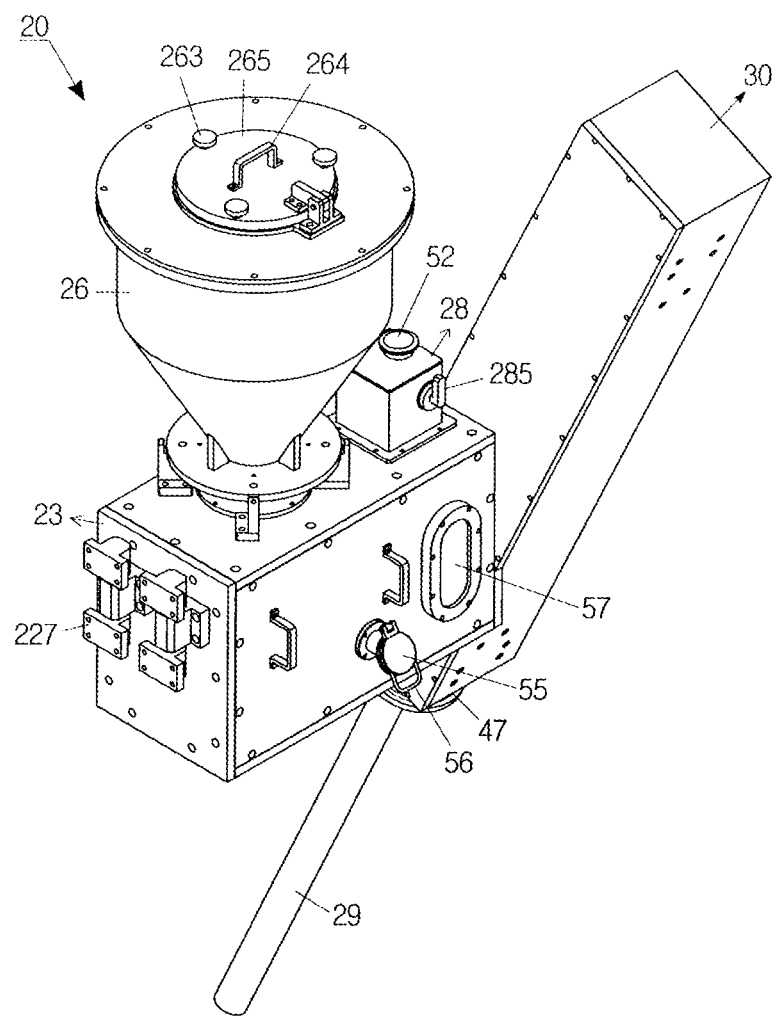
[FIG. 3]

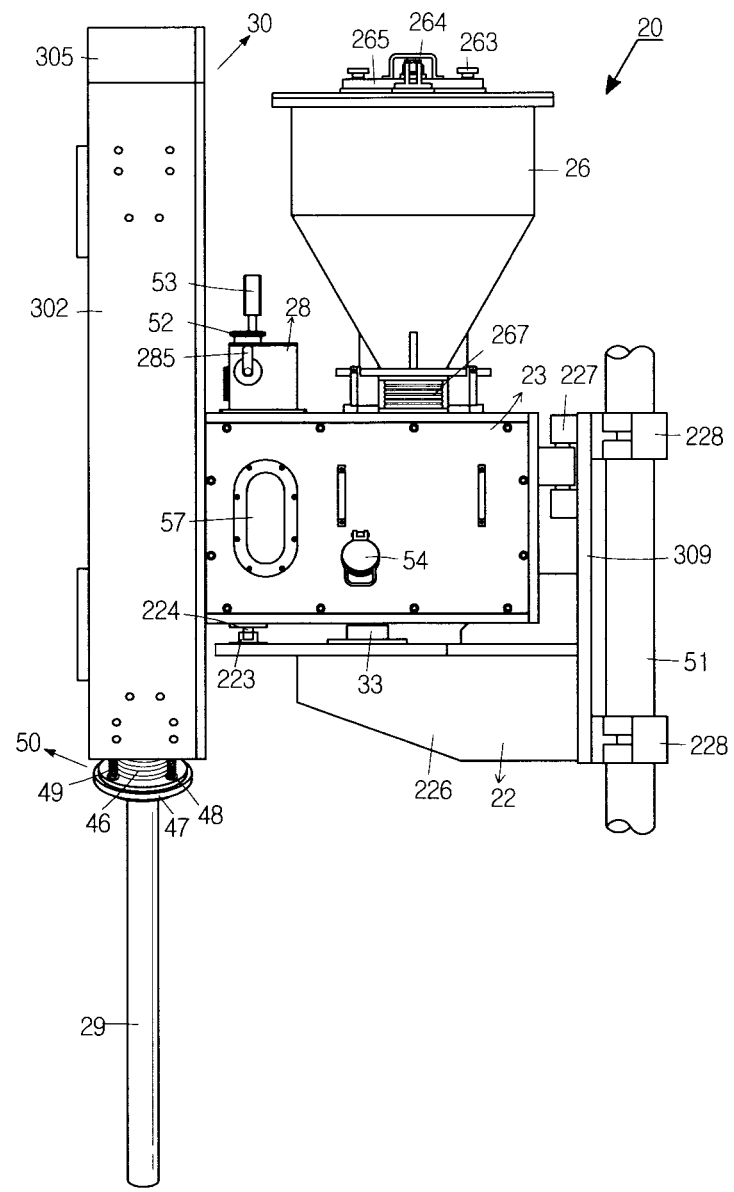
[FIG. 4]

[FIG. 5]
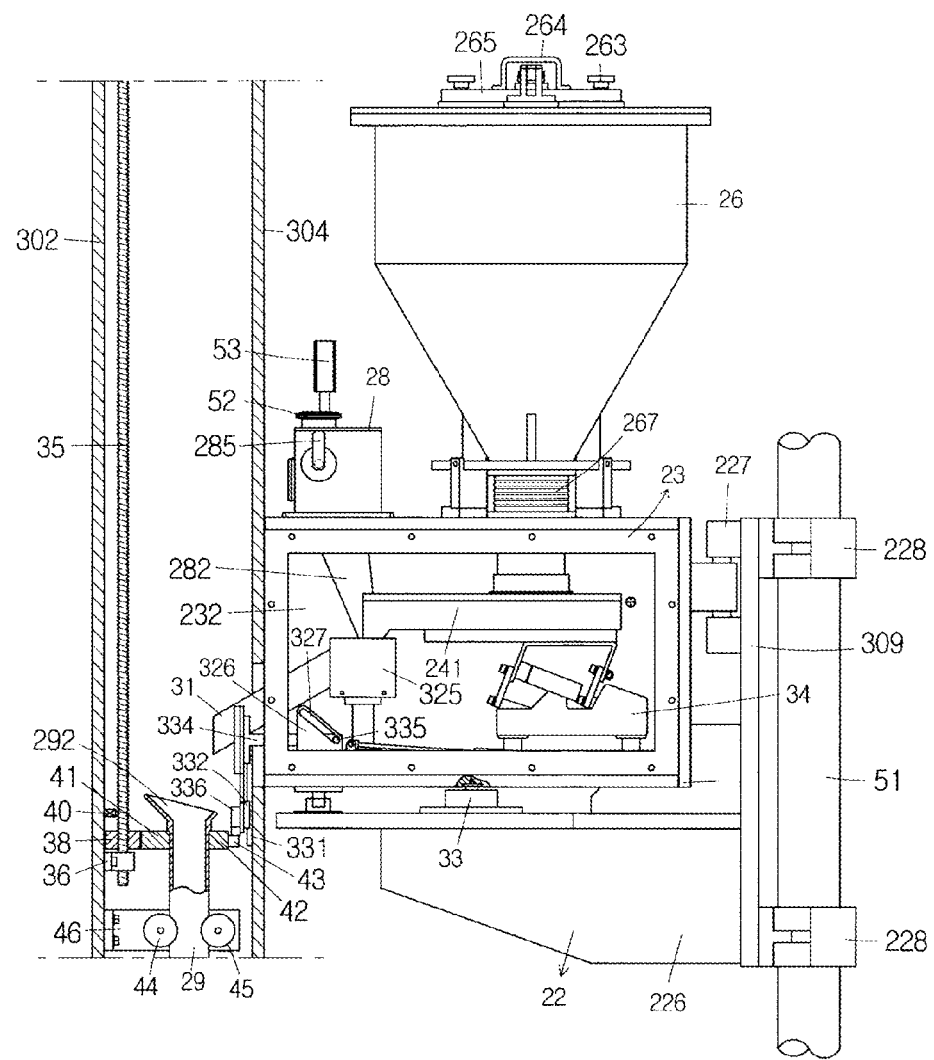

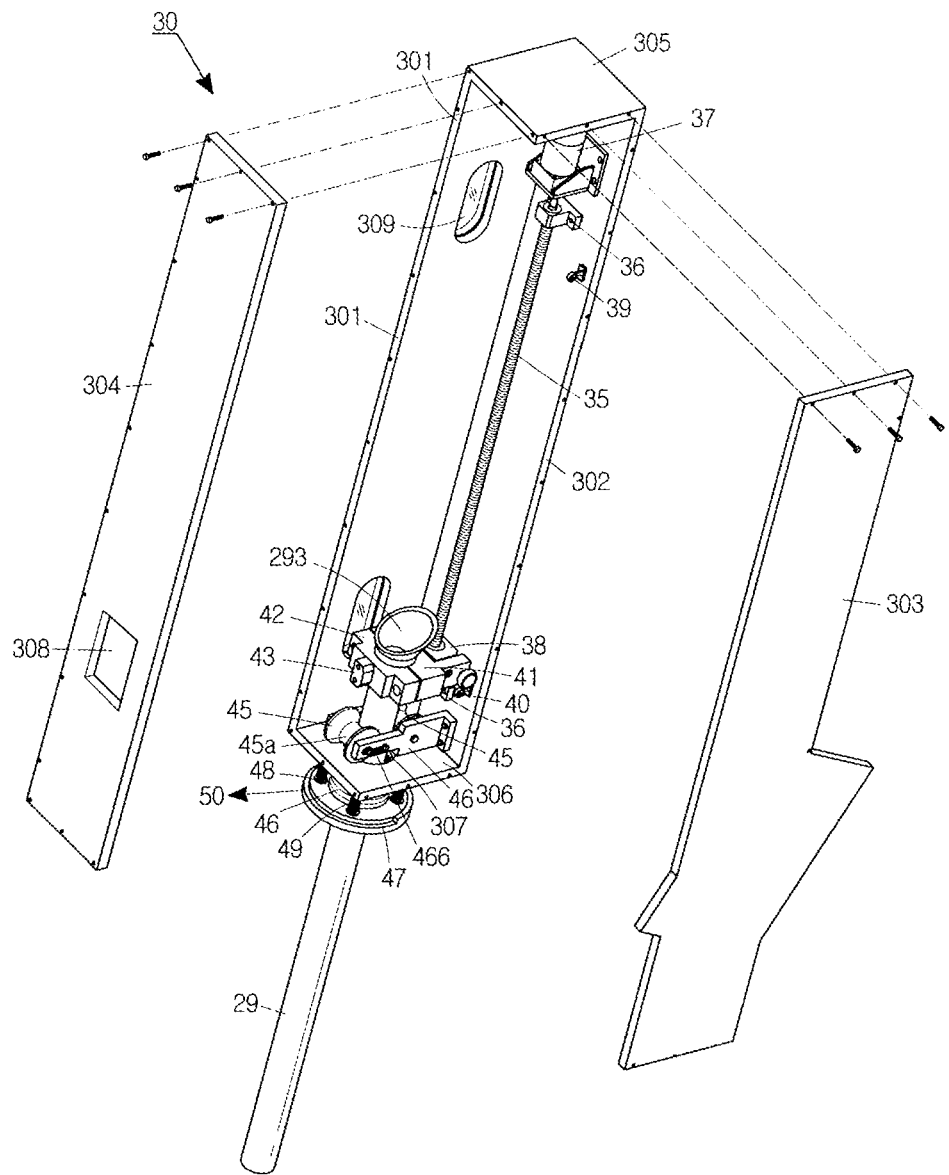
【FIG. 6】

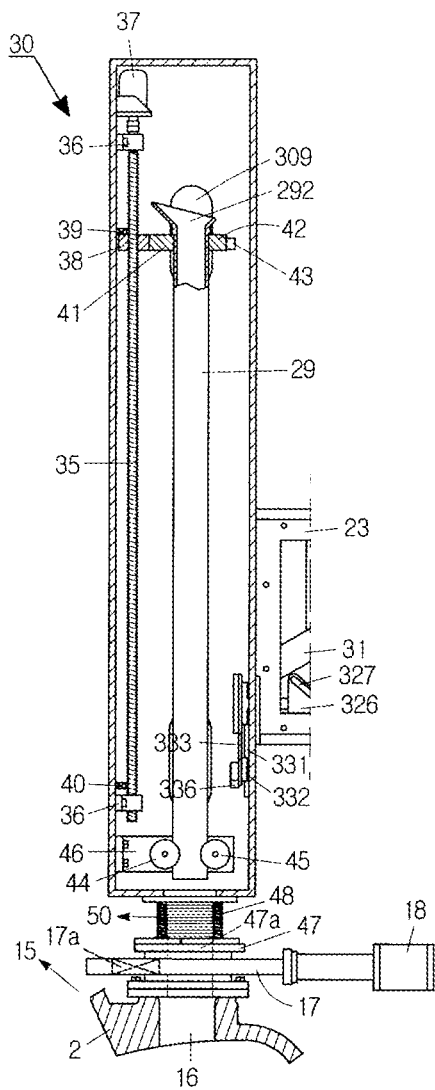
[FIG. 7]

【FIG. 8】
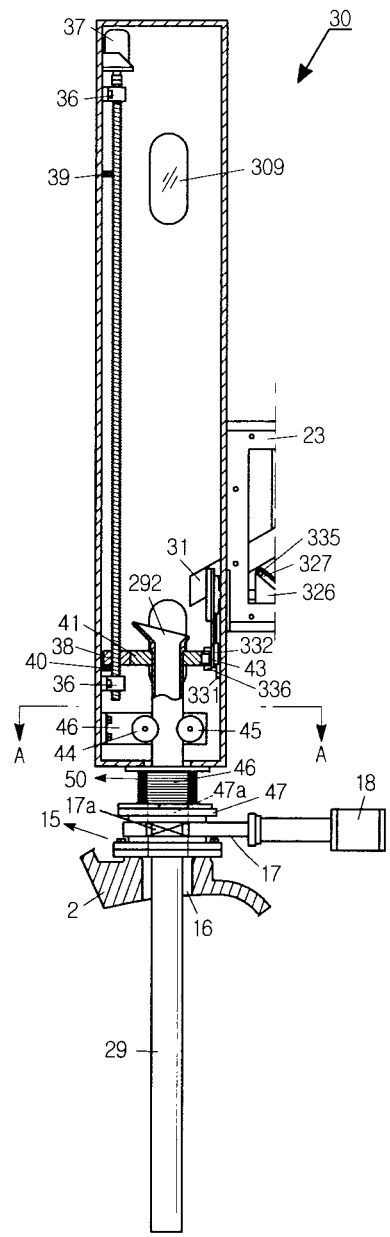

[FIG. 9]
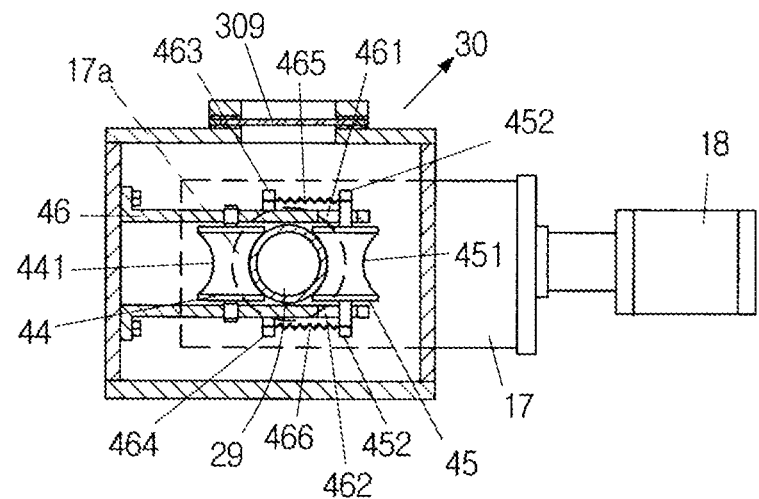
[FIG. 10]
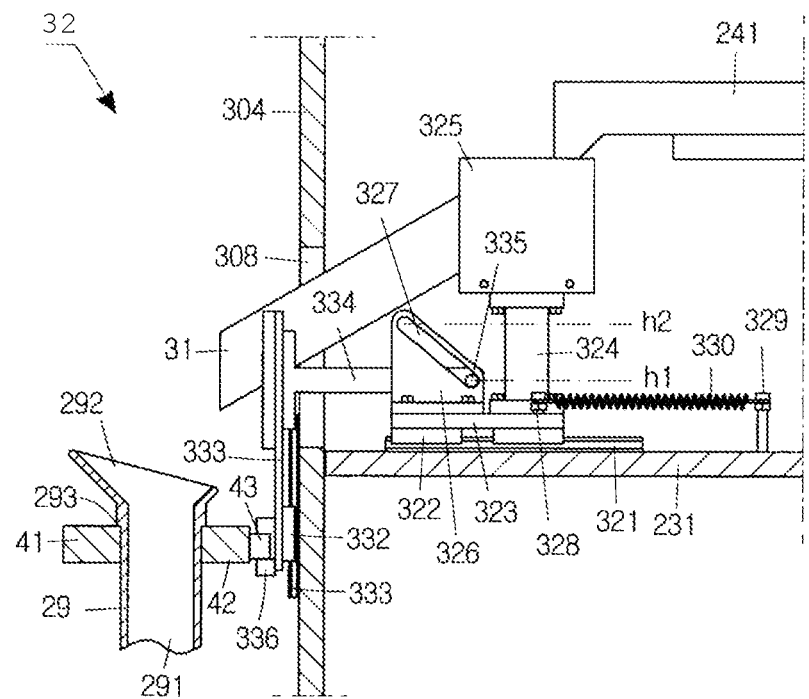

[FIG. 11]
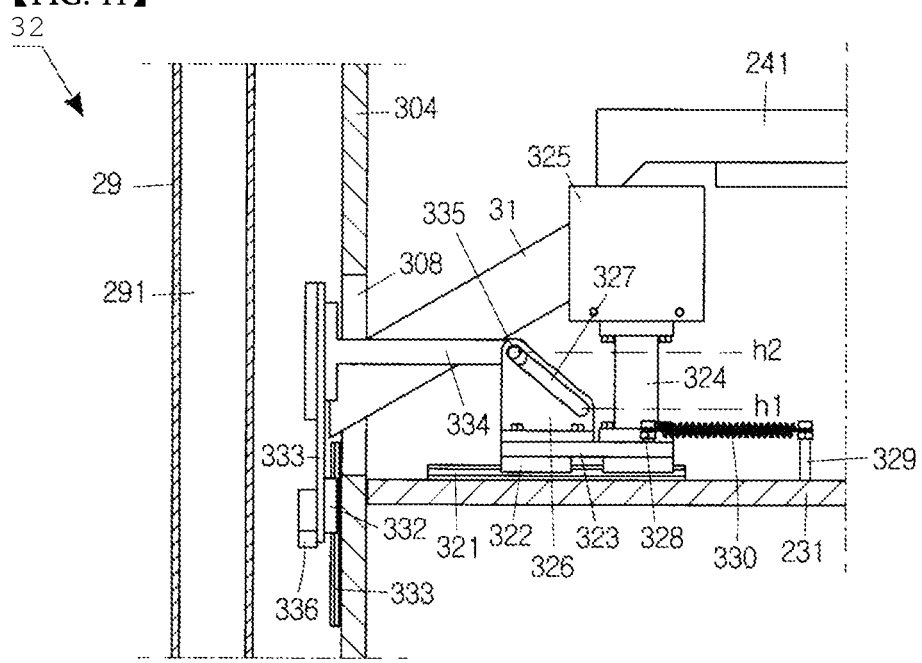

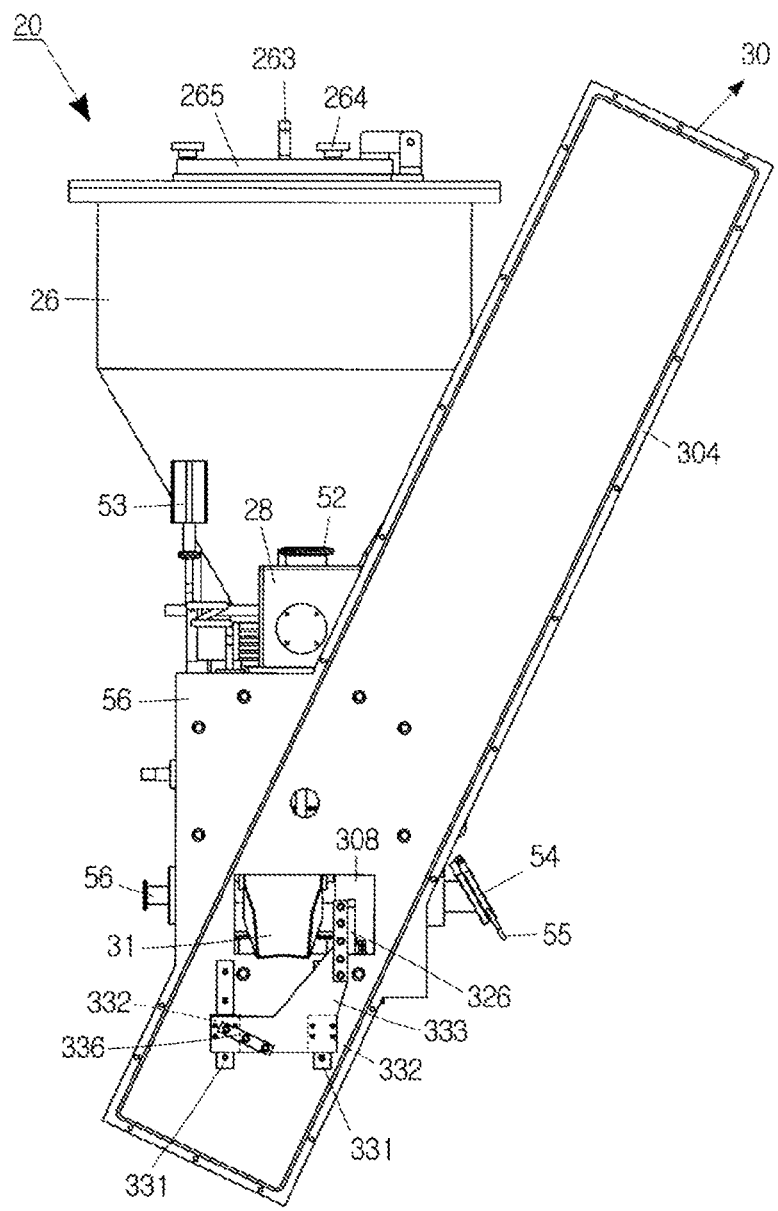
[FIG. 12]

[FIG. 13]
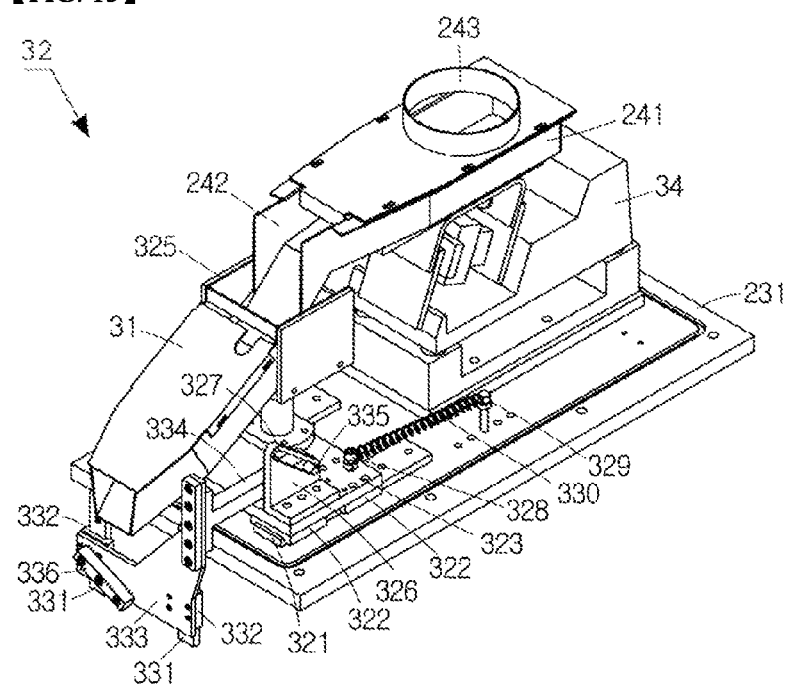

[FIG. 14]
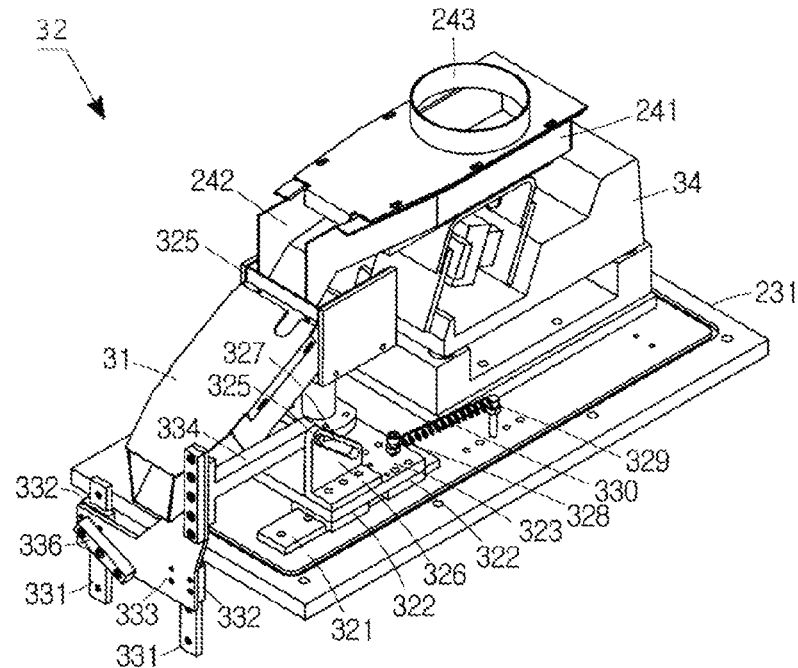
[FIG. 15]
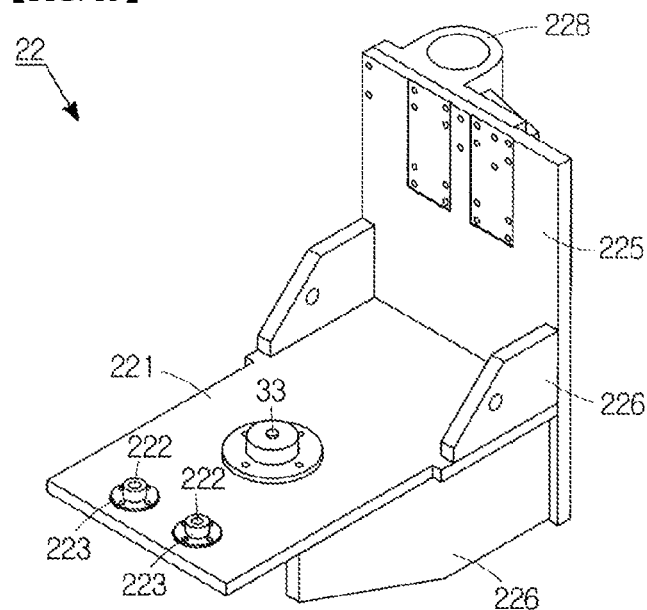

[FIG. 16]
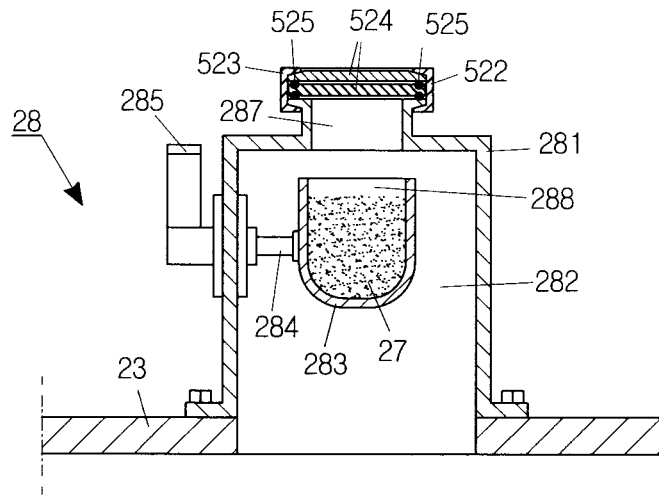
[FIG. 17]
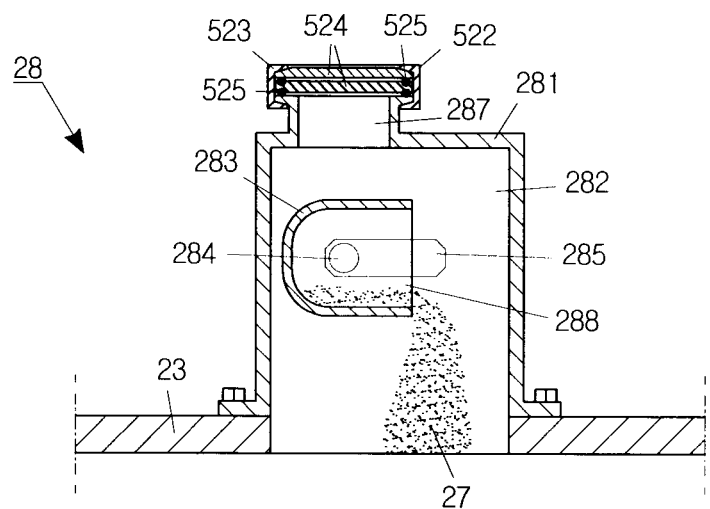
[FIG. 18]
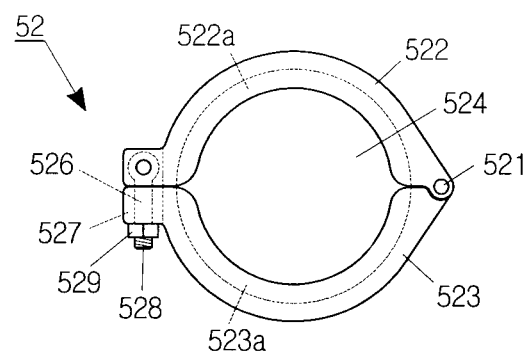

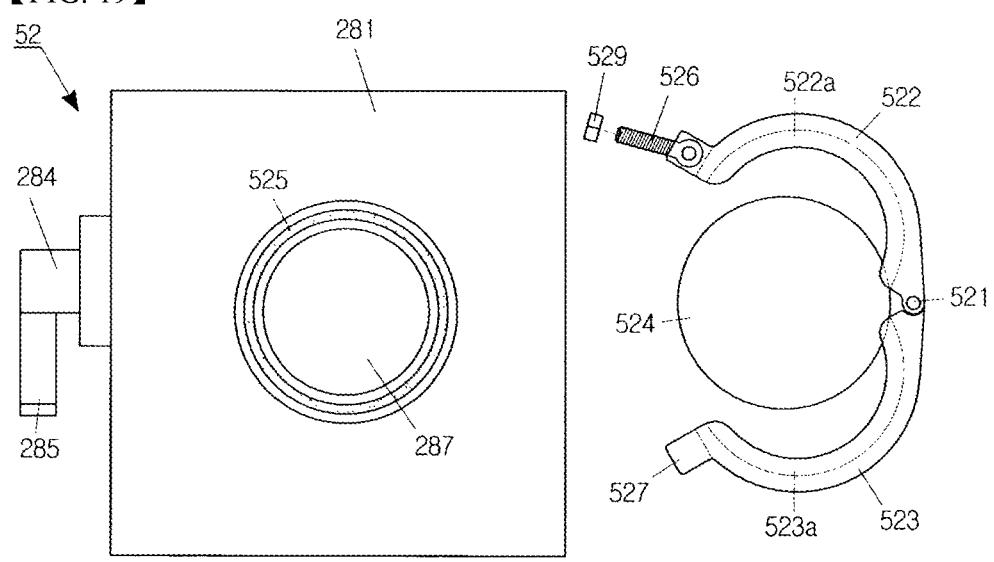
[FIG. 19]

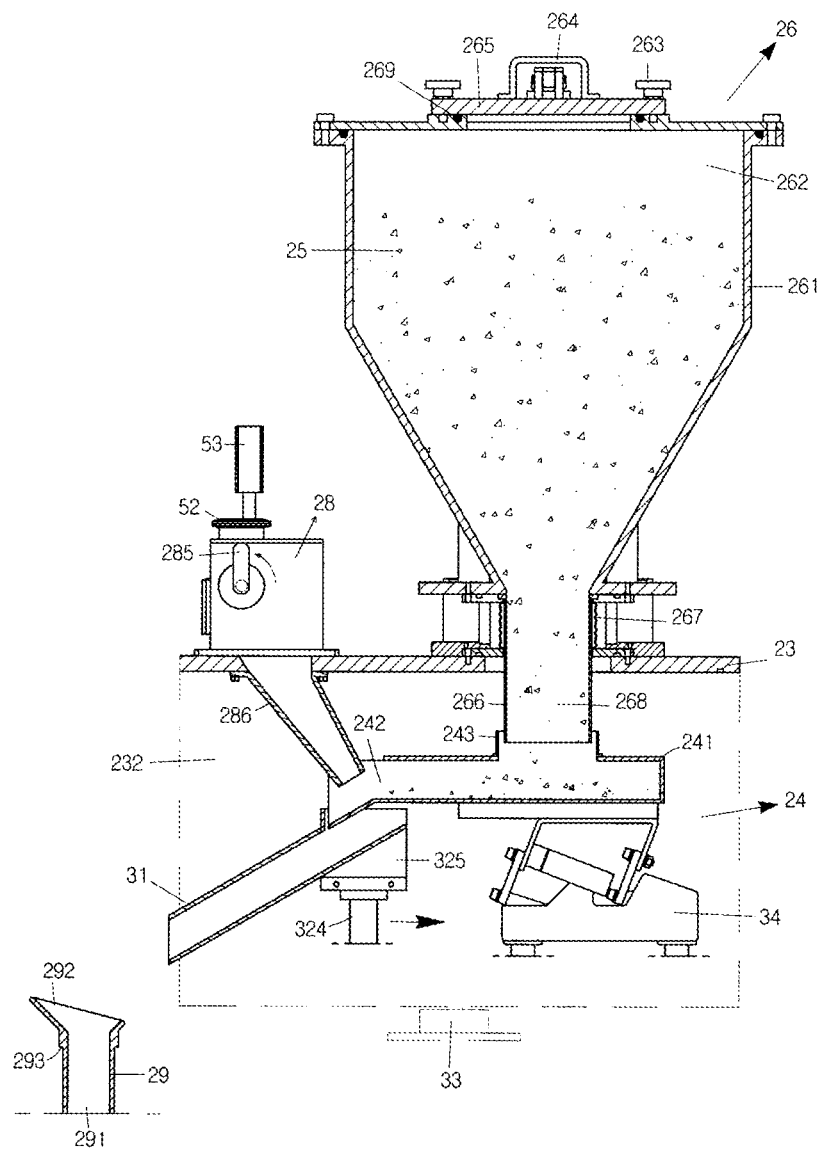
[FIG. 20]

【FIG. 21】
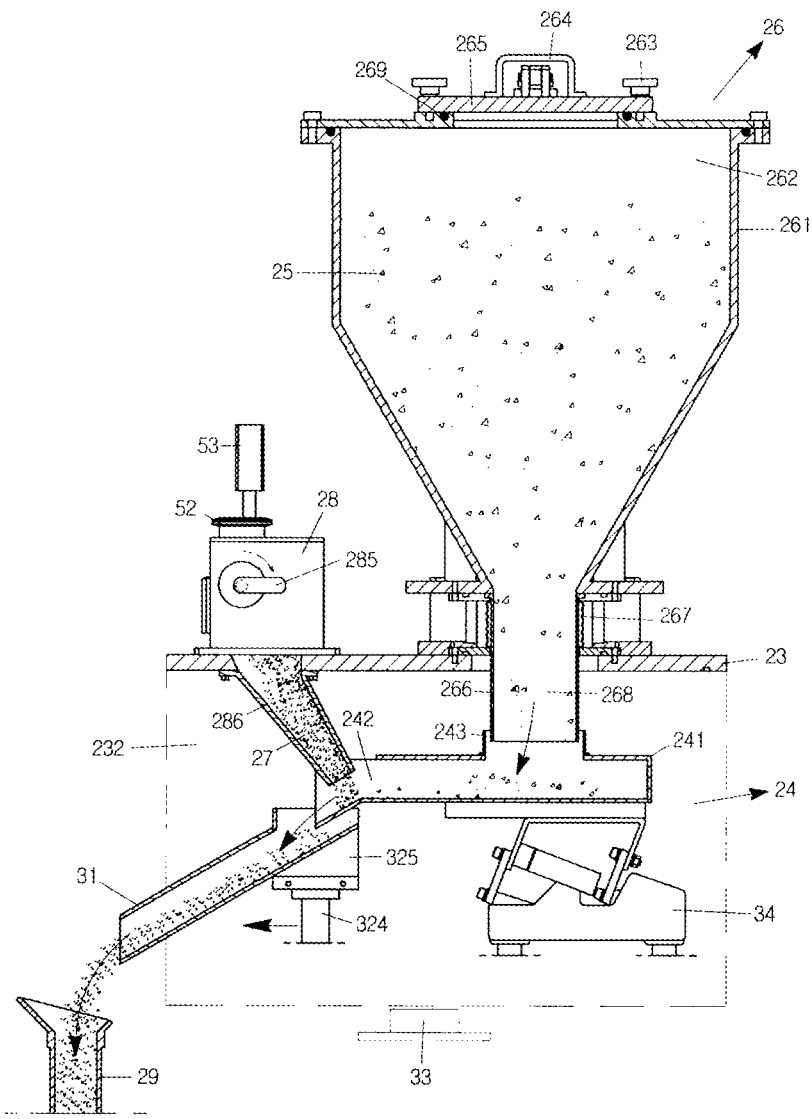

【FIG. 22】
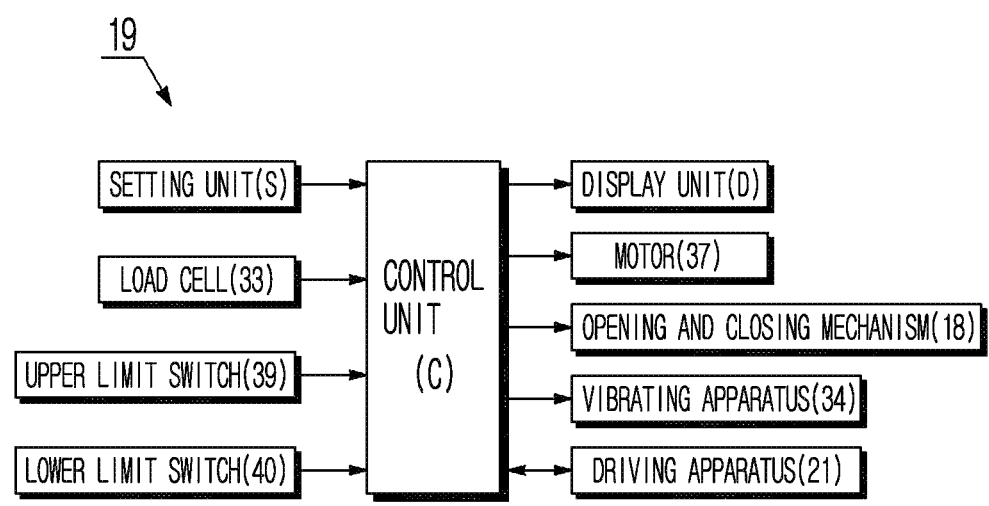

INGOT RAW MATERIAL SUPPLY SYSTEM

CROSS-REFERENCE TO RELATED APPLICATIONS

This application is the U.S. National Stage of International Patent Application No. PCT/KR2013/004346 which was filed on May 16, 2013, and which claims foreign priority to Korean Patent Appl. No. 10-2013-0055426 which was filed on May 16, 2013, the entire contents of which are incorporated by reference.

TECHNICAL FIELD

The present invention relates to an ingot raw material supply system for supplying a fixed amount of raw material and/or dopant necessary for ingot (single crystal silicon) growth (production) to a crucible of an ingot growth apparatus.

BACKGROUND ART

In general, an ingot growth apparatus using a Czochralski crystal growth process is configured such that solid raw material, such as polysilicon (or gallium arsenide) and dopant, is introduced (supplied)) into a crucible mounted in a hot zone, the solid raw material is heated and melted by an electric heater to form silicon hot melt, and a single crystal seed is slowly rotated and seeded in a state in which the single crystal seed is in contact with the silicon hot melt so as to obtain single crystal ingot having a predetermined length and a predetermined diameter.

Chunk polysilicon and granular polysilicon are used as polysilicon, which is raw material for ingot growth, and a predetermined amount of boron or phosphorus is generally used as dopant. Boron is used for P-type ingot growth, phosphorus is used for N-type ingot growth.

The above-mentioned raw materials are in a solid state. In order to melt the raw materials into silicon hot melt, therefore, chunk polysilicon is stacked in a dome shape in a state in which the dopant is put in the crucible. Even when chunk polysilicon, granular polysilicon, and dopant are filled and melted in the crucible, the volume of the silicon hot melt equivalent to gaps formed in the chunk polysilicon is reduced.

In addition, the silicon hot melt is gradually reduced according to the growth of an ingot with the result that the level of the silicon hot melt is lowered. In this case, the change in level of the silicon hot melt is detected using a distance measurement mechanism, and the crucible is moved upward using a lifting mechanism according to the detected change in level of the silicon hot melt such that the level of the silicon hot melt can be uniformly maintained. However, accurate control is difficult, and the supply of a fixed amount of raw material is not easy. Consequently, the diameter of the grown ingot is not uniform, and concentration of the dopant is changed in a direction in which the ingot is seeded. As a result, there occurs a so-called segregation phenomenon in which the quality of the ingot is not uniform.

In order to grow an ingot having a desired diameter and a desired length while uniformly maintaining quality of the grown ingot, therefore, it is necessary to quantitatively supply an amount of ingot raw material (polysilicon and dopant) equivalent to the volume reduced according to ingot growth (or volume required for ingot growth).

DISCLOSURE

Technical Problem

It is an object of the present invention to provide an ingot raw material supply system that is capable of supplying a fixed amount of raw material (ingot raw material) and/or dopant necessary for ingot (single crystal silicon) growth (production) to a crucible of an ingot growth apparatus.

It is another object of the present invention to provide an ingot raw material supply system that is capable of supplying a fixed amount of raw material necessary for ingot growth, thereby greatly improving productivity and quality of the ingot.

It is a further object of the present invention to provide a gate valve that is capable of blocking high temperature heat introduced into an ingot raw material supply apparatus via a supply pipe while maintaining a vacuum state when raw material necessary for ingot growth is supplied.

Technical Solution

In accordance with an aspect of the present invention, the above and other objects can be accomplished by the provision of an ingot raw material supply apparatus including a support unit, an enclosure mounted at an upper part of the support unit, a fixed amount supply unit mounted in the enclosure, a hopper mounted at one side of an upper part of the enclosure for supplying raw material to the fixed amount supply unit, a dopant supply unit mounted at one side of the upper part of the enclosure for supplying a predetermined amount of dopant into the enclosure, a supply pipe for supplying a fixed amount of raw material discharged from the fixed amount supply unit and dopant discharged from the dopant supply unit to a crucible, a lifting mechanism mounted at a side of the enclosure for moving the supply pipe upward and downward, a docking unit mounted at a lower part of the lifting mechanism, a moving mechanism for protruding an inclined chute to an upper part of the supply pipe when the supply pipe is moved downward, and a load cell mounted at a base of the enclosure.

According to a characteristic of the present invention, the moving mechanism may include a pair of left and right LM rails (321) fixed to a top of a bottom plate (231) of the enclosure (23), LM blocks (322) coupled to the LM rails (321), a plate member (323) fixed to tops of the LM blocks (322), a vertical member (324) fixed to one side of a top of the plate member (323), an inclined chute (31) fixed to an upper part of the vertical member (324), a guide plate (326) mounted at the top of the plate member (323), an inclined hole (327) formed at an upper part of the guide plate (326), a spring (330) mounted between a vertical rod (328) fixed to the plate member (324) and a vertical rod (329) fixed to the bottom plate (231), LM rails (331) perpendicularly mounted at a side plate (304), LM blocks (332) coupled to the LM rails (331), a connection plate (333) fixed to surfaces of the LM blocks (332), an operating stem (334) protruding to a rear end of an upper part of the connection plate (333), an operating pin (335) mounted at an end of the operating stem (334) such that the operating pin (335) is coupled in the inclined hole (327), and an inclined member (336) mounted at one side of a front of the connection plate (333) in an inclined fashion such that the inclined member (336) can be moved downward by a push block (43)

According to another characteristic of the present invention, the dopant supply unit may include a housing (281) mounted at the upper part of the enclosure (23) such that the housing (281) is spatially connected to a raw material supply chamber (232) formed in the enclosure (23), a receiving chamber (282) formed in the housing (281), a storage receptacle (283) located in the receiving chamber (282) for storing dopant (27), an opening part (288) open to an upper part of the storage receptacle (283), a rotary rod (284) horizontally mounted at one side of an outside of the storage receptacle (283), the rotary rod (284) extending outside the housing (281), a tilting handle (285) mounted at an end of the rotary rod (284) for rotating the storage receptacle (283) in a vertical direction and in a horizontal direction, a chute (286) mounted at a lower part of the receiving chamber (282), a dopant introduction port (287) formed at an upper part of the housing (281), and a locking mechanism (52) mounted at the dopant introduction port (287).

According to another characteristic of the present invention, the locking mechanism may include a plurality of caps (524) coupled to a top of the dopant introduction port (287) of the housing (281), semicircular pressure support members (522) (523) configured to be widened or narrowed about an axial pin (521), receiving grooves (522a) (523a) formed at insides of the pressure support members (522) (523), a plurality of O-rings (525) coupled between the dopant introduction port (287) and the respective caps (524) for achieving airtightness, a fastening rod (526) axially mounted at an end of the pressure support member (522), a coupling groove (527) formed at an end of the pressure support member (522) such that the end of the fastening rod (526) is coupled into the coupling groove (527), and a nut (529) fastened to a screw part (528) of the fastening rod (526) fitted in the coupling groove (527).

According to another characteristic of the present invention, the lifting mechanism may include a plurality of long side plates (301) (302) (303) (304), an upper plate (305), and a lower plate (306) coupled to one another in the shape of a rectangular box for forming a space therein, a hole (308) formed at the side plate (304) such that the inclined chute (31) is introduced into and withdrawn from the lifting mechanism through the hole (308), an introduction and withdrawal hole (307) formed at the lower plate (306) such that the supply pipe (29) is introduced into and withdrawn from the lifting mechanism through the introduction and withdrawal hole (307), a screw (35) axially mounted at an inside of the side plate (302) in a longitudinal direction of the side plate (302), a motor (37) for rotating the screw (35) in a forward direction or in a reverse direction, a moving body (38) threadedly coupled to an outside of the screw (35), and an upper limit switch (39) and a lower limit switch (40) mounted at an upper part and a lower part of an inside of the side plate (302), respectively.

According to another characteristic of the present invention, the fixed amount supply unit may include a vibrating apparatus mounted in the enclosure, a vibrating chute fixed to an upper part of the vibrating apparatus for moving the raw material discharged from the hopper downward to the inclined chute in a vibrating fashion, a discharge unit provided at one side of the vibrating chute, and the inclined chute mounted at a lower part of the discharge unit such that the inclined chute is moved forward or backward in a direction toward the supply pipe by the moving mechanism.

According to another characteristic of the present invention, the docking unit may include an expansible bellows pipe (46) fixed to a bottom of a lower plate (306) of the lifting mechanism, a coupling ring (47) fixed to a bottom of the bellows pipe (46), a pass hole (47a) formed at a center of the coupling ring (47), a plurality of guide rods (48) fixed to the bottom of the lower plate (306) for guiding the coupling ring (47), a stopper formed at an end of each of the guide rods (48) for preventing separation of the coupling ring (47), and a spring (49) mounted at each of the guide rods (48) for elastically supporting the coupling ring (47).

According to another characteristic of the present invention, the hopper may be mounted at the upper part of the enclosure, and the hopper may include a hopper body (261) having a wide upper part and a narrow lower part, a charging chamber (262) of a predetermined capacity formed in the hopper body (261), a door (265) mounted at the upper part of the hopper body (261), the door (265) having a locking mechanism (263) and a handle (264), a downward discharge pipe (266) mounted at the lower part of the hopper body (261), a bellows pipe (267) mounted at an outside of the discharge pipe (266), and a discharge hole (268) formed in the discharge pipe (266).

According to a further characteristic of the present invention, the load cell may input a weight value of the raw material sensed in real time to a controller, and the controller may control the input value such that the input value is equal to a set value using a method of controlling vibration intensity and vibration cycle of a vibrating apparatus, thereby achieving supply of a fixed amount of the raw material.

In accordance with another aspect of the present invention, there is provided an ingot raw material supply method including a) charging an ingot raw material supply apparatus with a predetermined amount of raw material and/or dopant, b) docking a docking unit of the ingot raw material supply apparatus to a hatch of an ingot growth apparatus, c) evacuating a raw material supply chamber of the ingot raw material supply apparatus using a vacuum mechanism, d) injecting an argon gas into an ingot growth chamber of the ingot growth apparatus and the raw material supply chamber of the ingot raw material supply apparatus to create the same vacuum atmosphere, e) opening a gate valve mounted at the hatch to connect the ingot growth chamber of the ingot growth apparatus with the raw material supply chamber of the ingot raw material supply apparatus into one space, f) moving a supply pipe downward to an upper part of a crucible using a lifting mechanism, g) feeding a fixed amount of raw material and dopant to the supply pipe using a vibrating apparatus and a load cell of the ingot raw material supply apparatus, h) supplying the raw material and the dopant fed to the supply pipe to the crucible in a downward sliding fashion, i) returning the supply pipe, into which the raw material and the dopant has been introduced, upward using the lifting mechanism, j) closing the gate valve to isolate the ingot growth chamber of the ingot growth apparatus and the raw material supply chamber of the ingot raw material supply apparatus from each other, k) releasing a vacuum state of the ingot raw material supply apparatus, and l) undocking the docking unit of the ingot raw material supply apparatus from the hatch of the ingot growth apparatus.

According to a characteristic of the present invention, at step d), the argon gas may be injected into the raw material supply chamber of the ingot raw material supply apparatus to create a vacuum degree and a vacuum atmosphere equal to or equivalent to that of the ingot growth chamber of the ingot growth apparatus such that the raw material supply chamber and the ingot growth chamber can be connected into one space during the supply of the raw material and/or the dopant.

Advantageous Effects

Raw material is melted to growth ingot with the result that the amount of the raw material is reduced. According to the present invention, it is possible to further supply an amount of new raw material equivalent to the reduced amount of the raw material. Consequently, the present invention has the effect of greatly improving productivity and quality of the ingot.

According to the present invention, it is possible to timely supply raw material necessary for ingot growth. Consequently, the present invention has the effect of growing an ingot having a desired size (diameter and/or length).

According to the present invention, it is possible to automatically charge ingot raw material, to continuously supply raw material 25 in a vibrating fashion, and to supply a fixed amount of the raw material 25 while accurately measuring the supply amount of the raw material 25 using a vibrating apparatus 34 and a load cell 33.

According to the present invention, a TM screw is used as a screw 35, and therefore it is possible to accurately move a supply pipe 29 upward and downward. Consequently, the present invention has the effect of preventing backlash and fixing the position of the supply pipe 29 when a motor 37 is stopped or a motor brake is out of order.

According to the present invention, a vibrating chute 241 and the vibrating apparatus 34 are integrally combined. Consequently, the present invention has the effect of reducing the volume and weight of the ingot raw material supply apparatus. In addition, it is possible to prevent a bridge phenomenon due to calculation of a tilt angle of an inclined chute 31 and a unit area of the inclined chute 31 and testing of the inclined chute 31. Consequently, the present invention has the effect of achieving smooth operation of the ingot raw material supply apparatus.

According to the present invention, the supply pipe 29 is preferably made of a quartz tube exhibiting high heat resistance, and upward and downward movement of the quartz tube exhibiting low strength is supported by a pair of guide rollers 44 and 45. Consequently, the present invention has the effect of achieving stability in stoppage and upward and downward movement of the supply pipe 29.

According to the present invention, it is possible to achieve easy docking and airtightness based on sliding of a gate valve 17 and elasticity of a spring 49 of a docking unit 50.

According to the present invention, it is possible to easily supply dopant 27 to a crucible 3 using a tilting handle 285. In addition, it is possible to monitor a vacuum degree and a process flow through a display unit D.

According to the present invention, an ingot raw material supply apparatus 20 is moved upward or downward and rotated by a driving apparatus 21 such that the ingot raw material supply apparatus 20 can be docked to or undocked from a hatch 15. When charging a hopper 26 with raw material 25 (introducing raw material 25 into the hopper 26), the ingot raw material supply apparatus 20 can be moved downward to a position suitable for a worker to conduct operations using the driving apparatus 21. Consequently, the present invention has the effect of achieving high workability.

DESCRIPTION OF DRAWINGS

FIG. 1 is a flowchart showing a process of an example of the present invention.

FIG. 2 is a view showing an installation state of an example of the present invention.

FIG. 3 is a perspective view showing an example of the present invention.

FIG. 4 is a front view showing an example of the present invention.

FIG. 5 is a partial sectional view showing an example of the present invention.

FIG. 6 is an exploded perspective view showing a supply pipe and a supply pipe lifting mechanism of the present invention.

FIG. 7 is a sectional view of the supply pipe lifting mechanism of the present invention showing a state in which the supply pipe is returned upward.

FIG. 8 is a sectional view of the supply pipe lifting mechanism of the present invention showing a state in which the supply pipe is moved upward.

FIG. 9 is a sectional view taken along line A-A' of FIG. 8 showing an example of the present invention.

FIG. 10 is a partial sectional view of an inclined chute of the present invention showing a state in which the inclined chute is protruded.

FIG. 11 is a partial sectional view of the inclined chute of the present invention showing a state in which the inclined chute is retreated.

FIG. 12 is a partial front view showing the inclined chute of the present invention.

FIG. 13 is a perspective view of an inclined chute moving mechanism of the present invention showing a state in which the inclined chute is protruded.

FIG. 14 is a perspective view of the inclined chute moving mechanism of the present invention showing a state in which the inclined chute is retreated.

FIG. 15 is a partial front view showing an enclosure support unit of the present invention.

FIG. 16 is a sectional view of a dopant supply unit of the present invention showing a state in which the dopant supply unit is charged with a dopant.

FIG. 17 is a sectional view of the dopant supply unit of the present invention showing a state in which the dopant is discharged from the dopant supply unit.

FIG. 18 is a plan view showing a locking mechanism of the dopant supply unit of the present invention.

FIG. 19 is a plan view showing the locking mechanism of the dopant supply unit of the present invention in a state in which the locking mechanism is separated.

FIG. 20 is a sectional view showing an enclosure of the present invention before a raw material is supplied to the enclosure unit.

FIG. 21 is a sectional view showing the enclosure of the present invention in a state in which a raw material is supplied to the enclosure unit.

FIG. 22 is a circuit diagram showing a controller of the present invention.

| <Description of Reference Numerals> | |
|---|---|
| 1: Ingot growth apparatus | 2: Main chamber |
| 3: Crucible | 4: Support mechanism |
| 15: Hatch | 16: Opening |
| 17: Gate valve | 18: Opening and closing mechanism |
| 19: Controller | 20: Raw material supply apparatus |
| 21: Driving apparatus | 22: Support unit |
| 23: Enclosure | 24: Fixed amount supply unit |
| 25: Raw material | 26: Hopper |
| 27: Dopant | 28: Dopant supply unit |
| 29: Supply plate | 30: Lifting mechanism |
| 31: Inclined chute | 32: Moving mechanism |
| 33: Load cell | 34: Vibrating apparatus |
| 35: Screw | 36: Axial brackets |
| 37: Motor | 38: Moving body |
| 39: Upper limit switch | 40: Lower limit switch |

-continued

<Description of Reference Numerals>

| | |
|---|---|
| 41: Fixed block | 42: Pressure support block |
| 43: Push block | 44, 45: Guide rollers |
| 44a, 45a: Guide grooves of guide rollers | 146: Bracket |
| 46, 267: Bellows pipes | 47: Coupling ring |
| 47a: Pass hole | 48: Guide rods |
| 49: Spring | 50: Docking unit |
| 261: Hopper body | 262: Charging chamber |
| 263: Locking mechanism | 264: Handle |
| 265: Door | 266: Discharge pipe |
| 268: Discharge hole | 269: Packing (O-ring) |
| 241: Vibrating chute | 243: Through hole |
| 291: Hollow part of supply pipe | 292: Inlet of supply pipe |
| 293: Step part of supply pipe | 231: Bottom plate |
| 301, 302, 303, 304: Side plates | 305: Upper plate |
| 306: Lower plate | 307: Introduction and withdrawal hole |
| 308: Hole | 309: See-through window |
| 321, 331: LM rails | 322, 332: LM blocks |
| 323: Plate member | 324: Vertical member |
| 325: Receiving chamber | 326: Guide plate |
| 327: Inclined hole | 328, 329: Vertical rods |
| 330: Spring | 333: Connection plate |
| 334: Operating stem | 335: Operating pin |
| 336: Inclined member | C: Control unit |
| S: Setting unit | D: Display unit |

BEST MODE

Hereinafter, preferred embodiments of the present invention will be described in detail with reference to the accompanying drawings. In the following description of the embodiments of the present invention, the same elements are denoted by the same reference numerals, and a detailed description of known configurations and functions incorporated herein will be omitted when it may obscure the subject matter of the present invention.

FIG. 1 is a flowchart showing an ingot raw material supply method according to an example of the present invention. The ingot raw material supply method includes a) a step of charging a hopper 26 and a dopant supply unit 28 of an ingot raw material supply apparatus 20 with a predetermined amount of raw material 25 and/or dopant 27 (introducing a predetermined amount of raw material 25 and/or dopant 27 into a hopper 26 and a dopant supply unit 28 of an ingot raw material supply apparatus 20), b) a step of docking a docking unit 50 of the ingot raw material supply apparatus 20 to a hatch 15 of an ingot growth apparatus 1, c) a step of evacuating the ingot raw material supply apparatus 20 using a vacuum mechanism, d) a step of injecting an argon gas into an ingot growth chamber 2a of the ingot growth apparatus 1 and/or a raw material supply chamber 232 of the ingot raw material supply apparatus 20 to create a vacuum atmosphere, e) a step of opening a gate valve 17 mounted at the hatch 15 to connect the ingot growth chamber (the interior of a base chamber) 2a of the ingot growth apparatus 1 with the raw material supply chamber 232 of the ingot raw material supply apparatus 20 into one space, f) a step of moving a supply pipe 29 downward to the upper part of a crucible 3 using a lifting mechanism 30, g) a step of feeding a fixed amount of raw material 25 to the supply pipe 29 using a vibrating apparatus 34 and a load cell 33, h) a step of supplying the raw material 25 and/or the dopant 27 fed to the supply pipe 29 to the crucible 3 in a downward sliding (falling) fashion, i) a step of returning the supply pipe 29, into which the raw material 25 and the dopant 27 has been introduced, upward using the lifting mechanism 30, j) a step of closing the gate valve 17 to isolate the ingot growth chamber 2a of the ingot growth apparatus 1 and the raw material supply chamber 232 of the ingot raw material supply apparatus 20 from each other, k) a step of releasing a vacuum state of the ingot raw material supply apparatus 20, and l) a step of undocking the docking unit 50 of the ingot raw material supply apparatus 20 from the hatch 15 of the ingot growth apparatus 1 to separate the ingot raw material supply apparatus 20 from the hatch 15 of the ingot growth apparatus 1.

In the present invention, steps a) to l) are repeated during ingot growth, before ingot growth, or after ingot growth, thereby achieving continuous or periodic ingot growth.

At step b), airtightness between the hatch 15 of the ingot growth apparatus 1 and the docking unit 50 of the ingot raw material supply apparatus 20 is maintained.

At step c), the ingot raw material supply apparatus 20 is evacuated such that the ingot raw material supply apparatus 20 has a vacuum degree (vacuum atmosphere) equal to or equivalent to that of the ingot growth chamber 2a, thereby not disturbing (obstructing) ingot growth.

At step d), the argon gas is injected into the raw material supply chamber 232 of the ingot raw material supply apparatus 20 to create a vacuum degree and a vacuum atmosphere equal to or equivalent to that of the ingot growth chamber 2a of the ingot growth apparatus 1 such that the raw material supply chamber 232 and the ingot growth chamber 2a can be easily connected into one space during the supply of the raw material 25.

FIG. 2 is a view showing an example of an ingot growth apparatus (or an ingot production apparatus) 1 equipped with an ingot raw material supply apparatus 20 for supplying a fixed amount of raw material 25 to a crucible 3 according to the present invention.

The ingot growth apparatus 1 includes a main chamber 2 provided with a cooling mechanism, a crucible 3 mounted in the main chamber 2 for melting poly silicon (raw material), a support mechanism 4 for supporting the crucible 3, a driving shaft 5 and a driving mechanism 6 for raising and rotating the support mechanism 4, an electric heater 7 for heating the crucible 3, an electric power supply mechanism for supplying high electric power to the electric heater 7, a dome chamber 8 mounted at the upper part of the main chamber 2, a gate valve and a viewport mounted at the dome chamber 8, a heat insulation member 9 mounted at the upper part of the crucible 3, a seed mechanism 10 mounted at a pull chamber disposed at the upper part of the dome chamber 8, a seed cable 11 mounted at the seed mechanism 10 for seeding ingot (not shown) and a load cell 12 mounted at the seed mechanism 10 for measuring the weight of the seeded ingot, a seed chuck 13 mounted at the lower end of the seed cable 11, a charge coupled device (CCD) camera for taking an image of a hot melt surface of silicon hot melt through the viewport 14, a laser distance measuring instrument, a vacuum mechanism, a cooling mechanism, a sensing mechanism, a measuring mechanism, and a control mechanism.

The ingot raw material supply apparatus 20 of the present invention is moved upward and rotated by a driving apparatus 21 such that a docking unit 50 of the ingot raw material supply apparatus 20 is docked to a hatch 15 provided at one side of the upper part of the main chamber 2. When the same vacuum atmosphere as in the main chamber 2 is created in the ingot raw material supply apparatus 20, a predetermined amount of raw material (including dopant) 25 is supplied to the crucible 3. Subsequently, the ingot raw material supply apparatus 20 is rotated and moved downward by the driving apparatus 21 such that the docking unit 50 is undocked from the hatch 15. The hatch 15 is provided with an opening 16, through which a supply pipe 29 of the ingot raw material supply apparatus 20 is moved upward and downward. The opening 16 is opened and closed when the supply pipe 29 is moved upward and downward by a gate valve 17 such that the same vacuum atmosphere as in the main chamber 2 is maintained in the ingot raw material supply apparatus 20. The gate valve 17 is opened and closed by an opening and closing mechanism 18. The opening and closing mechanism 18 is controlled by a controller 19.

The gate valve 17 mounted in the opening 16 is provided with a sealing mechanism for sealing the hatch 15 when the ingot raw material supply apparatus 20 is undocked from the hatch 15 so as to maintain airtightness, thereby not destroying (lowering) the vacuum atmosphere in the main chamber 2.

The gate valve 17 is provided with a pass hole 17a, through which the supply pipe 29 passes, the pass hole 17a is located at the upper part of the opening 16 in an open state. The pass hole 17a has an inner diameter slightly greater than an outer diameter of the supply pipe 29 such that the supply pipe 29 does not contact the pass hole 17a when the supply pipe 29 passes through the pass hole 17a.

FIG. 3 is a perspective view showing an ingot raw material supply apparatus 20 according to an example of the present invention, FIG. 4 is a side view of the ingot raw material supply apparatus 20, and FIG. 5 is a partial sectional view of the ingot raw material supply apparatus 20. The ingot raw material supply apparatus 20 includes a support unit 22 mounted at the upper part of the driving apparatus 21, an enclosure 23 mounted at the upper part of the support unit 22, a fixed amount supply unit 24 mounted in the enclosure 23, a hopper 26 mounted at one side of the upper part of the enclosure 23 for supplying raw material 25 to the fixed amount supply unit 24, a dopant supply unit 28 mounted at one side of the upper part of the enclosure 23 for supplying a predetermined amount of dopant 27 into the enclosure 23, a supply pipe 29 for supplying a fixed amount of raw material 25 discharged from the fixed amount supply unit 24 and dopant 27 discharged from the dopant supply unit 28 to the crucible 3, a lifting mechanism 30 mounted at a side of the enclosure 23 for moving the supply pipe 29 upward and downward, a moving mechanism 32 for protruding an inclined chute 31 to the upper part of the supply pipe 29 when the supply pipe 29 is moved downward to supply the raw material 25 to the supply pipe 29 in a falling fashion, and a load cell 33 mounted between the support unit 22 and the enclosure 23 for sensing the weight of the raw material 25 and inputting the sensed weight of the raw material 25 to the controller 19, thereby achieving the supply of a fixed amount of the raw material 25.

The fixed amount supply unit 24 further includes a vibrating apparatus 34 for controlling (regulating) the supply amount of the raw material 25 in a vibrating fashion.

As shown in FIGS. 20 and 21, the hopper 26 mounted at the upper part of the enclosure 23 is configured such that a charging chamber 262 of a predetermined capacity, in which raw material 25 is charged, is formed in a hopper body 261 having a wide upper part and a narrow lower part, a door 265 having a locking mechanism 263 and a handle 264 is mounted at the upper part of the hopper body 261, a downward discharge pipe 266 is mounted at the lower part of the hopper body 261, a bellows pipe 267 is mounted at the outside of the discharge pipe 266, and the discharge pipe 266 is provided at the inside thereof with a discharge hole 268, through which the raw material 25 from the charging chamber 262 is discharged to the fixed amount supply unit 24 in a falling fashion.

A packing (O-ring) 269 is mounted at a portion of the hopper at which the door 265 is opened and closed such that airtightness of the charging chamber 262 is maintained. A raw material supply chamber 232 is formed in the enclosure 23.

The fixed amount supply unit 24 includes a vibrating apparatus 34 mounted in the enclosure 23, a vibrating chute 241 fixed to the upper part of the vibrating apparatus 34 for moving the raw material 25 discharged from the discharge pipe 266 downward to the inclined chute 31 in a vibrating fashion, a discharge unit 242 provided at one side of the vibrating chute 241, and the inclined chute 31 mounted at the lower part of the discharge unit 242 such that the inclined chute 31 is moved forward or backward (protruded or retreated) in a direction toward the supply pipe 29 or the vibrating apparatus 34 by the moving mechanism 32.

The vibrating chute 241 is provided at the upper part thereof with a through hole 243, in which the discharge pipe 266 is coupled. Between the discharge pipe 266 and the through hole 243 is formed a gap for preventing contact between the discharge pipe 266 and the through hole 243 when the vibrating chute 241 is vibrated.

The vibrating apparatus 34 is connected to the controller 19 such that vibration intensity (vibration strength) and vibration cycle of the vibrating apparatus 34 is controlled by the controller 19. A supply speed of the raw material 25 is adjusted based on the vibration intensity and/or the vibration cycle of the vibrating apparatus 34. In addition, a weight value (data) of the raw material 25 sensed by the load cell 33 in real time is input to the controller 19, which compares the input value with a predetermined supply amount of raw material (a set value). Using a method of controlling the vibration intensity and/or the vibration cycle of the vibrating apparatus 34, the controller 19 controls the input value such that the input value is equal to the set value, thereby achieving the supply of a fixed amount of the raw material 25.

The lifting mechanism 30 is configured such that a plurality of long side plates 301, 302, 303, and 304, an upper plate 305, and a lower plate 306 are coupled to one another in the shape of a rectangular box for forming a space therein, the side plate 304 is provided with a hole 308, through which the inclined chute 31 is introduced into and withdrawn from the lifting mechanism 30, the lower plate 306 is provided with an introduction and withdrawal hole 307, through which the supply pipe 29 is introduced into and withdrawn from the lifting mechanism 30, and the side plate 301 is provided with at least one see-through window 309, through which the space of the lifting mechanism 30 is monitored.

The side plate 302 is provided at a longitudinal inside thereof with a screw 35, the upper part and lower part of which are fixed by axial brackets 36. The side plate 302 is provided at the upper part of the inside thereof with a motor 37, which is rotated in the forward direction or in the reverse direction under control of the controller 19. A rotary shaft of the motor 37 is connected to one end of the screw 35 via an axial coupler such that the motor 37 and the screw 35 can be rotated in an interlocked fashion. A moving body 38 is threadedly coupled to the outside of the screw 35 such that the moving body 38 can move in a longitudinal direction of the screw 35. The side plate 302 is provided at the upper part and the lower part of the inside thereof with an upper limit switch 39 for limiting upward movement of the moving body 38 and a lower limit switch 40 for limiting downward movement of the moving body 38 to decide an upward and downward stroke of the supply pipe 29.

When the moving body 38 contacts or approaches the upper limit switch 39 and the lower limit switch 40, the upper limit switch 39 and the lower limit switch 40 inputs a limit signal to the controller 19. When the limit signal from the upper limit switch 39 and the lower limit switch 40 is input to the controller 19, the controller 19 controls the rotation of the motor 37 to be stopped such that the movement of the moving body 38 is stopped. When a reverse operation control signal or a reverse operation electric power from the controller 19 is input to the motor 37, the motor 37 is rotated in the opposite direction and then the rotation of the motor 37 is stopped according to the limit signal input from the upper limit switch 39 and the lower limit switch 40.

In the present invention, a TM screw is used as the screw 35. Consequently, it is possible to accurately move the supply pipe 29 upward and downward, thereby preventing backlash. In addition, the position of the supply pipe 29 may be fixed when the motor 37 or a motor brake mounted in the motor 37 is out of order.

The moving body 38 is provided with a fixed block 41 having a semicircular coupling hole. A pressure support block 42 having a semicircular coupling hole is fastened to the front of the fixed block 41. As a result, a circular coupling hole is provided. The upper part of the supply pipe 29 is coupled to the circular coupling hole such that the supply pipe 29 can move upward and downward along the moving body 38.

The supply pipe 29 is preferably made of a quartz tube exhibiting high heat resistance. The supply pipe 29 is provided at a longitudinal inside thereof with a hollow part 291. The supply pipe 29 is provided at the upper part thereof with an inlet 292 formed in the shape of an inclined hopper (a hopper which is inclined in a direction opposite to a raw material introduction direction) having a large outer diameter sufficient to introduce the raw material 25 and/or the dopant 27 therethrough. The supply pipe 29 is provided at the outer circumference of the upper part thereof with a step part 293 having an outer diameter greater than the average outer diameter of the supply pipe 29. The step part 293 is caught by the upper part of the coupling hole between the fixed block 41 and the pressure support block 42. The pressure support block 42 is provided at the front thereof with a push block 43 for pushing the moving mechanism 32, which moves the inclined chute 31, which will hereinafter be described.

A bracket 146 is fixed to the lower part of the side plate 302 of the lifting mechanism 30. A pair of guide rollers 44 and 45 for supporting the supply pipe 29 is axially mounted at the bracket 146 thereby achieving stability in stoppage and upward and downward movement of the supply pipe 29.

The guide rollers 44 and 45 are provided respectively with semicircular or almost semicircular guide grooves 441 and 451 for surrounding the outer circumference of the supply pipe 29 to support the supply pipe 29 such that the supply pipe 29 is stably moved upward and downward in a state in which the dislocation of the supply pipe 29 is prevented.

As shown in FIG. 9, the guide roller 44 is axially mounted at the bracket 46. Opposite long holes 461 and 462 are formed at one end of the bracket 46. Shaft rods 452 protruding from opposite sides of the guide roller 45 are coupled through the long holes 461 and 462 such that the shaft rods 452 can be moved in the long holes 461 and 462. Support rods 463 and 464 are fixed to the outside of the bracket 46. Springs 465 and 466 are coupled respectively between one of the shaft rods 452 of the guide roller 45 and the support rod 463 and between the other of the shaft rods 452 of the guide roller 45 and the support rod 464 for elastically supporting the guide roller 45 toward the guide roller 44 to guide the supply pipe 29.

The lower plate 306 of the lifting mechanism 30 is provided with an introduction and withdrawal hole 307, through which the supply pipe 29 is introduced into and withdrawn from the lifting mechanism 30. The docking unit 50 is provided at the bottom of the lower plate 306.

The docking unit 50 includes an expansible bellows pipe 46 fixed to the bottom of the lower plate 306 of the lifting mechanism 30, a coupling ring 47 fixed to the bottom of the bellows pipe 46 such that the coupling ring 47 can be docked to and undocked from the top of the hatch 15, a pass hole 47a formed at the center of the coupling ring 47 such that the supply pipe 29 passes through the pass hole 47a, a plurality of guide rods 48 fixed to the bottom of the lower plate 306 for guiding the coupling ring 47, a stopper, formed at an end of each of the guide rods 48, having an outer diameter slightly greater than the average outer diameter of each of the guide rods 48, for preventing separation of the coupling ring 47, and a spring 49 mounted at each of the guide rods 48 for elastically supporting the coupling ring 47.

The supply pipe 29 is moved upward and downward through the introduction and withdrawal hole 307 formed at the lower plate 306, a hollow part (not shown) formed in the bellows pipe 46, and the pass hole 47a formed at the center of the coupling ring 47.

When the docking unit 50 of the ingot raw material supply apparatus 20 of the present invention is docked to the hatch 15 of the ingot growth apparatus 1 as shown in FIG. 2, the bottom of the coupling ring 47 comes into tight contact with the top of the hatch 15 by elastic support force of the springs 49. As a result, airtightness sufficient to endure vacuum pressure or vacuum atmosphere is maintained.

The moving mechanism 32 for moving the inclined chute 31 such that the inclined chute 31 is protruded to the upper part of the supply pipe 29 is configured as follows.

The moving mechanism 32 includes a pair of left and right LM rails 321 fixed to the top of a bottom plate 231 of the enclosure 23, a pair of front and rear LM blocks 322 coupled to the LM rails 321 such that the front and rear LM blocks 322 can be reciprocated in a longitudinal direction of the LM rails 321, a plate member 323 fixed to the tops of the LM blocks 322, a vertical member 324 fixed to one side of the top of the plate member 323, a receiving chamber 325 fixed to the upper part of the vertical member 324, the receiving chamber 325 being provided at the rear end of the inclined chute 31, a guide plate 326 mounted at the top of the plate member 323, an inclined hole 327 formed at the upper part of the guide plate 326, a spring 330 mounted between a vertical rod 328 fixed to the plate member 324 and a vertical rod 329 fixed to the bottom plate 231, a pair of LM rails 331 perpendicularly mounted at the side plate 304, a pair of LM blocks 332 coupled to the LM rails 331 such that the LM blocks 332 can be reciprocated in a longitudinal direction of the LM rails 331, a connection plate 333 fixed to the surfaces of the LM blocks 332, an operating stem 334 protruding to the rear end of the upper part of the connection plate 333, an operating pin 335 mounted at an end of the operating stem 334 such that the operating pin 335 is coupled in the inclined hole 327, and an inclined member 336 mounted at one side of the front of the connection plate 333 in an inclined fashion such that the inclined member 336 can be moved downward by the push block 43.

FIGS. 5, 8, 10, 13, and 31 show a state in which the supply pipe 29 is moved downward, the inclined chute 31 is protruded, and the raw material is supplied into the crucible 3. On the other hand, FIGS. 7, 11, 14, and 20 show a state in which the inclined chute 31 is retreated by elastic force of the spring 330, the supply pipe 29 is returned upward, and the supply of the raw material 25 and/or the dopant 27 is finished or completed.

As shown in FIGS. 7, 11, and 14, the inclined chute 31 is retreated by the elastic force of the spring 330 such that the inclined chute 31 does not interfere with the supply pipe 29 when the supply pipe 29 is moved upward. When the downward movement of the supply pipe 29 is almost completed, as shown in FIGS. 5, 8, 10, and 13, the push block 43 pushes the inclined member 336 downward, the connection plate 333 and the operating stem 334 are moved downward, and the plate member 323, the vertical member 324, and the inclined chute 31 are protruded to the upper part of the supply pipe 29, which has been moved downward, by an action between the operating pin 335 and the inclined hole 327. As a result, as shown in FIG. 21, a fixed amount of the discharged raw material 25 slides downward along the inclined chute 31 and is then introduced into the inlet 292 of the supply pipe 29.

The operation process of the present invention is as follows. In a state in which the hopper 26 and a storage receptacle 283 are charged with a proper amount of raw material 25 and dopant 27, as shown in FIG. 2, the ingot raw material supply apparatus 20 of the present invention is moved upward and rotated by the driving apparatus 21 under control of the controller 19 such that the docking unit 50 is docked to the hatch 15 of the ingot growth apparatus 1. Subsequently, the raw material supply chamber 232 is evacuated by an evacuation mechanism, an argon gas is injected into the raw material supply chamber 232 through an injection port 56, and the gate valve 17 is opened by the controller 19. According to the rotation of the motor 37 in the forward direction, the screw 35 is rotated in the forward direction, and the moving body 38 is moved downward. As a result, the supply pipe 29 is also moved downward.

As the moving body 38 is continuously moved downward, as shown in FIGS. 5, 8, 10, and 13, the push block 43 fixed to the front of the pressure support block 42 pushes the inclined member 336. As a result, the connection plate 333 is moved downward while being guided by the LM rails 331 and the LM blocks 332, and the operating stem 334 fixed to the connection plate 333 is also moved downward. The operating pin 335 fixed to the operating stem 334 is moved downward along the inclined hole 327 to a position h1 shown in FIG. 10. As a result, the plate member 323, the vertical member 324, and the inclined chute 31 are moved in a direction opposite to the vibrating apparatus 34. The inclined chute is protruded and located at the upper part of the supply pipe 29, which has been moved downward. The supply pipe 29 is moved to the upper part of the crucible 3. As the moving body 38 contacts the lower limit switch 40, the motor 38 is stopped by the controller 19, and therefore the supply pipe 29 is not moved downward any longer such that the raw material 25 and/or the dopant 27 can be supplied. In this state, as shown in FIG. 21, a fixed amount of the supplied raw material 25 and/or dopant 27 slides downward along the inclined chute 31, is introduced into the inlet 292 of the supply pipe 29, slides downward along the supply pipe 29, and is supplied to the crucible 3.

On the other hand, a process of moving the supply pipe 29 upward and performing undocking after the supply of the raw material 25 to the crucible 3 is completed as follows.

In a state in which the supply of the raw material 25 and/or the dopant 27 to the crucible 3 is completed, the gate valve 17 is closed by the controller 19, the screw 35 is moved in the reverse direction according to the rotation of the motor 37 in the reverse direction, and the moving body 38 is moved upward. As a result, the supply pipe 29 is also moved upward.

As the moving body 38 is continuously moved upward, the push block 43, which is pushing the inclined member 336, is moved upward with the result that push force applied to the inclined member 336 is removed. Consequently, the plate member 323 is moved in a direction toward the vibrating apparatus 34 by elastic force of the spring 330 while being guided by the LM rails 321 and the LM blocks 322, and the operating pin 335 coupled in the inclined hole 327 of the guide plate 326 is moved upward to a position h2 shown in FIG. 11. As a result, the operating stem 334, the connection plate 333, and the inclined member 336 are returned upward while being guided by the LM guide. The vertical member 324 fixed to the plate member 323, the receiving chamber 325, and the inclined chute 31 are moved to the direction toward the vibrating apparatus 34. As a result, the inclined chute 31 is retreated such that the supply pipe 29 can be continuously moved upward without interference with the inclined chute 31.

As the moving body 38 is continuously moved upward according to the rotation of the motor 37 in the reverse direction, the moving body 38 comes into contact with the upper limit switch 39. As a result, the motor 37 is stopped by the controller 19, and therefore the supply pipe 29 is not moved upward any longer.

The gate valve 17 is in a closed state, and therefore, a vacuum degree and/or a vacuum atmosphere of the ingot growth chamber 2a is continuously maintained. When the ingot growth chamber 2a and the raw material supply chamber 232 are spatially separated from each other in a state in which the gate valve 17 is closed, a vacuum releasing member 54 is lifted up using a handle 55 to release a vacuum state of the raw material supply chamber 232, the driving apparatus 21 is operated reversely by the controller 19 such that the ingot raw material supply apparatus 20 is undocked and separated from the ingot growth apparatus 1. As a result, it is possible to recharge the ingot raw material supply apparatus 20 with raw material 25 and dopant 27 such that a subsequent supply process can be performed.

In the present invention, when the supply of the raw material 25 is completed, the ingot raw material supply apparatus 20 is undocked and separated from the ingot growth apparatus 1. Consequently, the ingot raw material supply apparatus 20 is fundamentally prevented from contacting high temperature heat rising upward from the crucible 3, and therefore, thermal stress applied to the ingot raw material supply apparatus 20 is solved.

The opening and closing mechanism 18 for opening and closing the gate valve 17 may be an air cylinder, a hydraulic cylinder, or a motor and a power transmission mechanism.

In the present invention, a detection mechanism for detecting a rotational direction, a rotational frequency, and/or a rotational angle of the motor 37 may be mounted at the motor 37 such the motor 37 can be accurately controlled. For example, an encoder, a contact sensor, a proximity sensor, or an optical sensor may be used as the detection mechanism. In the present invention, an encoder, which is mounted in the motor 37, may be used as the detection mechanism.

In the present invention, a weight sensing mechanism, such as a load cell 33, for sensing the supply amount (discharge amount) of raw material 25 in real time and inputting the sensed value to the controller 19 is mounted at the lower part of the enclosure 23. As shown in FIGS. 5 and 15, the load cell 33 is mounted at the top of the bottom plate 221 of the support unit 22 in such a manner that the load cell 33 supports the bottom of the enclosure 23 for sensing (detecting) the weight of the raw material 25 based on the weight (load) of the enclosure 23.

A pair of support rings 223 having upward coupling grooves 222 are fixed to the top of the front end of the bottom plate 221 in a forward and backward direction, and the coupling grooves 222 are coupled to coupling rods 224 provided at the bottom of the enclosure 23 in a loosened state. An allowable gap of 2 to 5 mm is provided between the coupling grooves 222 and the coupling rods 224 such that excessive motion of the front end of the enclosure 23 is prevented, and therefore the detection of weight performed by the load cell 33 is not disturbed. That is, the coupling grooves 222 and the coupling rods 224 are not a structure for supporting the enclosure 23 but a structure for preventing motion of the front end of the enclosure 23.

A vertical plate 225 is connected to the rear end of the support unit 22 in a state in which connection between the vertical plate 225 and the rear end of the support unit 22 is reinforced by brackets 226. The vertical plate 225 and the enclosure 23 are coupled to each other via a hinge 227 for supporting the rear end of the enclosure 23. Consequently, whole load of the apparatus and the components mounted in the enclosure 23, including the enclosure 23, is transmitted to the load cell 33.

Coupling rings 228 are mounted at the upper and lower parts of the rear of the vertical plate 225. A support rod 51 of the driving apparatus 21 is coupled through the coupling rings 228 such that the support unit 22 is supported.

The load cell 33 senses total weight in real time and then inputs the sensed weight to the controller 19. As the raw material 25 is supplied to the crucible 3, the total weight sensed by the load cell 33 is decreased. The controller 19 determines the supply amount of the raw material 25 based on comparison between the sensed value and a set value. Upon determining that the sensed value reaches the set value, the controller 19 controls the vibrating apparatus 34 to be stopped such that the supply of the raw material 25 is interrupted, thereby achieving the supply of a fixed amount of the raw material 25.

FIGS. 16 to 19 show the dopant supply unit 28 of the present invention. The dopant supply unit 28 is mounted at one side of the upper part of the enclosure 23.

The dopant supply unit 28 includes a housing 281 mounted at the upper part of the enclosure 23 such that the housing 281 is spatially connected to the raw material supply chamber 232 formed in the enclosure 23 while being airtightly isolated from the outside, a receiving chamber 282 formed in the housing 281, a storage receptacle 283 located in the receiving chamber 282 for storing dopant 27, an opening part 288 open to the upper part of the storage receptacle 283, a rotary rod 284 horizontally mounted at one side of the outside of the storage receptacle 283, the rotary rod 284 extending outside the housing 281, a tilting handle 285 mounted at an end of the rotary rod 284 for rotating the storage receptacle 283 in a vertical direction and in a horizontal direction, a chute 286 mounted at the lower part of the receiving chamber 282 for supplying the discharged dopant 27 to the discharge unit 242 in a falling fashion, and a locking mechanism 52 mounted at a dopant introduction port 287 formed at the upper part of the housing 281.

As shown in FIG. 18, the locking mechanism 52 is coupled to the top of the dopant introduction port 287 for maintaining airtightness. When dopant 27 is introduced, the locking mechanism 52 is separated from the dopant introduction port 287 as shown in FIG. 19.

The locking mechanism 52 includes semicircular pressure support members 522 and 523 configured to be widened or narrowed about an axial pin 521, receiving grooves 522a and 523a formed at insides of the pressure support members 522 and 523, a plurality of caps 524 coupled to the top of the dopant introduction port 287, a plurality of O-rings 525 coupled between the dopant introduction port 287 and the respective caps 524 for achieving airtightness, a fastening rod 526 axially mounted at an end of the pressure support member 522, a coupling groove 527 formed at an end of the pressure support member 522 such that the end of the fastening rod 526 is coupled into the coupling groove 527, and a nut 529 fastened to a screw part 528 of the fastening rod 526 fitted in the coupling groove 527.

FIG. 16 shows a state in which the storage receptacle 283 is charged with a predetermined amount of dopant 27, and the receiving chamber 282 is hermetically sealed by the caps 524, the O-rings 525, and the locking mechanism 52. FIG. 17 shows a state in which the storage receptacle 283 is inclined horizontally or below horizontally according to the rotation of the tilting handle 285, and the dopant 27 is discharged through the opening part 288 in a falling fashion. FIG. 21 shows a state in which the dopant 27 discharged in the falling fashion is fed to the discharge unit 242 along the chute 286 in a sliding fashion and then supplied to the crucible 3 via the inclined chute 31 and the supply pipe 29.

FIG. 22 is a circuit diagram showing the controller 19 of the present invention. A setting unit S including a keypad or a touchscreen for allowing selection of ON/OFF of the controller 19, setting of kinds of raw material, setting of the supply amount of the raw material, reset, etc., and input and setting of various kinds of data, the load cell 33 for measuring the weight of raw material 25, the upper limit switch 39 for sensing an upward movement limit of the supply pipe 29, and the lower limit switch 40 for sensing a downward movement limit of the supply pipe 29 are connected to an input of a control unit C constituted by a programmable logic controller (PLC), a central processing unit, or a microcomputer.

A display unit D for displaying various operation states, an operating mode, a set value, a current value, operation states of various devices, various abnormal states, etc., the motor 37 for rotating the screw 35 in the forward direction and in the reverse direction to move the supply pipe 29 upward and downward, the opening and closing mechanism 18 for opening and closing the gate valve 17, and the driving apparatus 21 for moving the ingot raw material supply apparatus 20 of the present invention upward and downward and for docking and undocking the ingot raw material supply apparatus 20 to and from the ingot growth apparatus 1 are connected to an output of the control unit C.

Memories constituted by various recording media, such as a hard disk, a flash memory, a read only memory (ROM), and a solid state drive (SSD) are connected to the input and output of the control unit C. Data input to or output from the control unit C are stored in the memories, read from the memories, and updated and stored in the memories.

Although not shown, a driving mechanism for driving various actuators may be connected to the output of the control unit C. The setting unit S may individually include a normal keypad, a switch group, or a touchscreen. Alternatively, the setting unit S may include a combination of the normal keypad, the switch group, and the touchscreen.

The display unit D displays operation states of an electric power indication lamp indicating an electric power supply state, various sensors, and actuators. The display unit D may individually include a liquid crystal display (LCD), a seven segment unit, or light emitting diodes. Alternatively, the display unit D may include a combination of the LCD, the seven segment unit, and the light emitting diodes. According to circumstances, a touchscreen may be used as the display unit, thereby improving user convenience.

Unexplained reference numeral 53 indicates a gauge for measuring a vacuum degree or vacuum pressure of the raw material supply chamber 232, unexplained reference numeral 54 indicates a vacuum releasing member, unexplained reference numeral 55 indicates a handle of the vacuum releasing member, unexplained reference numeral 56 indicates an argon gas injection port, and unexplained reference numeral 57 indicates a see-through window for monitoring the raw material supply chamber 232.

As described above, the supply pipe 29 is moved downward using the lifting mechanism 30, and then a fixed amount of raw material 25 is supplied to the crucible 3. When the supply of the raw material 25 is completed, the supply pipe 29 is returned upward using the lifting mechanism 30 such that the supply pipe 29 can be protected from high temperature heat.

According to the present invention, it is possible to achieve automatic charge of raw material, to achieve continuous supply of raw material 25, and to accurately measure the supply amount of the raw material 25 and supply the measured amount of the raw material 25 using the vibrating apparatus 34 and the load cell 33. It is possible to detect and verify the weight of the supplied raw material 25 using the load cell 33 in real time, thereby achieving the supply of a fixed amount of raw material.

According to the present invention, the vibrating chute 241 and the vibrating apparatus 34 are integrally combined such that the volume and weight of the ingot raw material supply apparatus can be reduced. In addition, it is possible to prevent a bridge phenomenon due to calculation of a tilt angle of a discharge channel of the inclined chute 31 and a unit area of the inclined chute 31 and testing of the inclined chute 31, thereby achieving operation of the ingot raw material supply apparatus without the occurrence of such a bridge phenomenon.

The ingot raw material supply apparatus 20 of the present invention is moved upward or downward and rotated by the driving apparatus 21 such that the ingot raw material supply apparatus 20 can be docked to or undocked from the hatch 15. When charging the hopper 26 with raw material 25 (introducing raw material 25 into the hopper 26), the ingot raw material supply apparatus 20 can be moved downward to a position suitable for a worker to conduct operations, thereby achieving high workability.

According to the present invention, it is possible to achieve easy docking and airtightness based on sliding of the gate valve 17 and elasticity of the spring 49 of the docking unit 50. In addition it is possible to easily supply dopant 27 to the crucible 3 using the tilting handle 285 and to monitor a vacuum degree and a process flow through the display unit D.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An ingot raw material supply apparatus comprising:
   a support unit;
   an enclosure mounted at an upper part of the support unit;
   a fixed amount supply unit mounted in the enclosure;
   a hopper mounted at one side of an upper part of the enclosure for supplying raw material to the fixed amount supply unit;
   a dopant supply unit mounted at one side of the upper part of the enclosure for supplying a predetermined amount of dopant into the enclosure;
   a supply pipe for supplying a fixed amount of raw material discharged from the fixed amount supply unit and dopant discharged from the dopant supply unit to a crucible;
   a lifting mechanism mounted at a side of the enclosure for moving the supply pipe upward and downward;
   a docking unit mounted at a lower part of the lifting mechanism;
   a moving mechanism for protruding an inclined chute to an upper part of the supply pipe when the supply pipe is moved downward; and
   a load cell mounted at a base of the enclosure,
   wherein the moving mechanism comprises:
   a pair of left and right LM rails (321) fixed to a top of a bottom plate (231) of the enclosure (23);
   LM blocks (322) coupled to the LM rails (321);
   a plate member (323) fixed to tops of the LM blocks (322);
   a vertical member (324) fixed to one side of a top of the plate member (323);
   an inclined chute (31) fixed to an upper part of the vertical member (324);
   a guide plate (326) mounted at the top of the plate member (323);
   an inclined hole (327) formed at an upper part of the guide plate (326);
   a spring (330) mounted between a vertical rod (328) fixed to the plate member (324) and a vertical rod (329) fixed to the bottom plate (231);
   LM rails (331) perpendicularly mounted at a side plate (304);
   LM blocks (332) coupled to the LM rails (331);
   a connection plate (333) fixed to surfaces of the LM blocks (332);
   an operating stem (334) protruding to a rear end of an upper part of the connection plate (333);
   an operating pin (335) mounted at an end of the operating stem (334) such that the operating pin (335) is coupled in the inclined hole (327); and
   an inclined member (336) mounted at one side of a front of the connection plate (333) in an inclined fashion such that the inclined member (336) can be moved downward by a push block (43).

2. The ingot raw material supply apparatus according to claim 1, wherein the dopant supply unit comprises:
   a housing (281) mounted at the upper part of the enclosure (23) such that the housing (281) is spatially connected to a raw material supply chamber (232) formed in the enclosure (23);
   a receiving chamber (282) formed in the housing (281);
   a storage receptacle (283) located in the receiving chamber (282) for storing dopant (27);
   an opening part (288) open to an upper part of the storage receptacle (283);
   a rotary rod (284) horizontally mounted at one side of an outside of the storage receptacle (283), the rotary rod (284) extending outside the housing (281);
   a tilting handle (285) mounted at an end of the rotary rod (284) for rotating the storage receptacle (283) in a vertical direction and in a horizontal direction;

a chute (286) mounted at a lower part of the receiving chamber (282);
a dopant introduction port (287) formed at an upper part of the housing (281); and
a locking mechanism (52) mounted at the dopant introduction port (287).

3. The ingot raw material supply apparatus according to claim 2, wherein the locking mechanism comprises:
a plurality of caps (524) coupled to a top of the dopant introduction port (287) of the housing (281);
semicircular pressure support members (522) (523) configured to be widened or narrowed about an axial pin (521);
receiving grooves (522a) (523a) formed at insides of the pressure support members (522) (523);
a plurality of O-rings (525) coupled between the dopant introduction port (287) and the respective caps (524) for achieving airtightness;
a fastening rod (526) axially mounted at an end of the pressure support member (522);
a coupling groove (527) formed at an end of the pressure support member (522) such that the end of the fastening rod (526) is coupled into the coupling groove (527); and
a nut (529) fastened to a screw part (528) of the fastening rod (526) fitted in the coupling groove (527).

4. The ingot raw material supply apparatus according to claim 1, wherein the lifting mechanism comprises:
a plurality of long side plates (301) (302) (303) (304), an upper plate (305), and a lower plate (306) coupled to one another in the shape of a rectangular box for forming a space therein;
a hole (308) formed at the side plate (304) such that the inclined chute (31) is introduced into and withdrawn from the lifting mechanism through the hole (308);
an introduction and withdrawal hole (307) formed at the lower plate (306) such that the supply pipe (29) is introduced into and withdrawn from the lifting mechanism through the introduction and withdrawal hole (307);
a screw (35) axially mounted at an inside of the side plate (302) in a longitudinal direction of the side plate (302);
a motor (37) for rotating the screw (35) in a forward direction or in a reverse direction;
a moving body (38) threadedly coupled to an outside of the screw (35); and
an upper limit switch (39) and a lower limit switch (40) mounted at an upper part and a lower part of an inside of the side plate (302), respectively.

5. The ingot raw material supply apparatus according to claim 1, wherein the fixed amount supply unit comprises:
a vibrating apparatus mounted in the enclosure;
a vibrating chute fixed to an upper part of the vibrating apparatus for moving the raw material discharged from the hopper downward to the inclined chute in a vibrating fashion;
a discharge unit provided at one side of the vibrating chute; and
the inclined chute mounted at a lower part of the discharge unit such that the inclined chute is moved forward or backward in a direction toward the supply pipe by the moving mechanism.

6. The ingot raw material supply apparatus according to claim 1, wherein the docking unit comprises:
an expansible bellows pipe (46) fixed to a bottom of a lower plate (306) of the lifting mechanism;
a coupling ring (47) fixed to a bottom of the bellows pipe (46);
a pass hole (47a) formed at a center of the coupling ring (47);
a plurality of guide rods (48) fixed to the bottom of the lower plate (306) for guiding the coupling ring (47);
a stopper formed at an end of each of the guide rods (48) for preventing separation of the coupling ring (47); and
a spring (49) mounted at each of the guide rods (48) for elastically supporting the coupling ring (47).

7. The ingot raw material supply apparatus according to claim 1, wherein
the hopper is mounted at the upper part of the enclosure, and
the hopper comprises:
a hopper body (261) having a wide upper part and a narrow lower part;
a charging chamber (262) of a predetermined capacity formed in the hopper body (261);
a door (265) mounted at the upper part of the hopper body (261), the door (265) having a locking mechanism (263) and a handle (264);
a downward discharge pipe (266) mounted at the lower part of the hopper body (261);
a bellows pipe (267) mounted at an outside of the discharge pipe (266); and
a discharge hole (268) formed in the discharge pipe (266).

8. The ingot raw material supply apparatus according to claim 1, wherein
the load cell inputs a weight value of the raw material sensed in real time to a controller, and
the controller controls the input value such that the input value is equal to a set value using a method of controlling vibration intensity and vibration cycle of a vibrating apparatus, thereby achieving supply of a fixed amount of the raw material.

9. The ingot raw material supply apparatus according to claim 1, wherein the dopant supply unit comprises:
a housing (281) mounted at the upper part of the enclosure (23) such that the housing (281) is spatially connected to a raw material supply chamber (232) formed in the enclosure (23);
a receiving chamber (282) formed in the housing (281);
a storage receptacle (283) located in the receiving chamber (282) for storing dopant (27);
an opening part (288) open to an upper part of the storage receptacle (283);
a rotary rod (284) horizontally mounted at one side of an outside of the storage receptacle (283), the rotary rod (284) extending outside the housing (281);
a tilting handle (285) mounted at an end of the rotary rod (284) for rotating the storage receptacle (283) in a vertical direction and in a horizontal direction;
a chute (286) mounted at a lower part of the receiving chamber (282);
a dopant introduction port (287) formed at an upper part of the housing (281); and
a locking mechanism (52) mounted at the dopant introduction port (287).

10. The ingot raw material supply apparatus according to claim 1, wherein the lifting mechanism comprises:
a plurality of long side plates (301) (302) (303) (304), an upper plate (305), and a lower plate (306) coupled to one another in the shape of a rectangular box for forming a space therein;

a hole (308) formed at the side plate (304) such that the inclined chute (31) is introduced into and withdrawn from the lifting mechanism through the hole (308);

an introduction and withdrawal hole (307) formed at the lower plate (306) such that the supply pipe (29) is introduced into and withdrawn from the lifting mechanism through the introduction and withdrawal hole (307);

a screw (35) axially mounted at an inside of the side plate (302) in a longitudinal direction of the side plate (302);

a motor (37) for rotating the screw (35) in a forward direction or in a reverse direction;

a moving body (38) threadedly coupled to an outside of the screw (35); and an upper limit switch (39) and a lower limit switch (40) mounted at an upper part and a lower part of an inside of the side plate (302), respectively.

11. The ingot raw material supply apparatus according to claim 1, wherein the fixed amount supply unit comprises:

a vibrating apparatus mounted in the enclosure;

a vibrating chute fixed to an upper part of the vibrating apparatus for moving the raw material discharged from the hopper downward to the inclined chute in a vibrating fashion;

a discharge unit provided at one side of the vibrating chute; and the inclined chute mounted at a lower part of the discharge unit such that the inclined chute is moved forward or backward in a direction toward the supply pipe by the moving mechanism.

12. The ingot raw material supply apparatus according to claim 1, wherein the docking unit comprises:

an expansible bellows pipe (46) fixed to a bottom of a lower plate (306) of the lifting mechanism;

a coupling ring (47) fixed to a bottom of the bellows pipe (46);

a pass hole (47a) formed at a center of the coupling ring (47);

a plurality of guide rods (48) fixed to the bottom of the lower plate (306) for guiding the coupling ring (47);

a stopper formed at an end of each of the guide rods (48) for preventing separation of the coupling ring (47); and a spring (49) mounted at each of the guide rods (48) for elastically supporting the coupling ring (47).

13. The ingot raw material supply apparatus according to claim 1, wherein the hopper is mounted at the upper part of the enclosure, and the hopper comprises:

a hopper body (261) having a wide upper part and a narrow lower part;

a charging chamber (262) of a predetermined capacity formed in the hopper body (261);

a door (265) mounted at the upper part of the hopper body (261), the door (265) having a locking mechanism (263) and a handle (264);

a downward discharge pipe (266) mounted at the lower part of the hopper body (261);

a bellows pipe (267) mounted at an outside of the discharge pipe (266); and a discharge hole (268) formed in the discharge pipe (266).

14. The ingot raw material supply apparatus according to claim 1, wherein the load cell inputs a weight value of the raw material sensed in real time to a controller, and the controller controls the input value such that the input value is equal to a set value using a method of controlling vibration intensity and vibration cycle of a vibrating apparatus, thereby achieving supply of a fixed amount of the raw material.

* * * * *